(12) United States Patent
Su

(10) Patent No.: US 11,398,441 B2
(45) Date of Patent: Jul. 26, 2022

(54) SEMICONDUCTOR DEVICE WITH SLANTED CONDUCTIVE LAYERS AND METHOD FOR FABRICATING THE SAME

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/020,170

(22) Filed: Sep. 14, 2020

(65) Prior Publication Data

US 2022/0084967 A1 Mar. 17, 2022

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01); *H01L 2224/0345* (2013.01); *H01L 2224/03452* (2013.01); *H01L 2224/03614* (2013.01); *H01L 2224/03616* (2013.01); *H01L 2224/0401* (2013.01); *H01L 2224/05087* (2013.01); *H01L 2224/05088* (2013.01); *H01L 2224/05098* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/05172* (2013.01); *H01L 2224/05184* (2013.01); *H01L 2224/13026* (2013.01); *H01L 2224/13111* (2013.01); *H01L 2224/13139* (2013.01); *H01L 2224/13144* (2013.01); *H01L 2224/13147* (2013.01); *H01L 2924/0104* (2013.01); *H01L 2924/01013* (2013.01); *H01L 2924/01022* (2013.01); *H01L 2924/01027* (2013.01); *H01L 2924/01029* (2013.01); *H01L 2924/01044* (2013.01); *H01L 2924/01073* (2013.01); *H01L 2924/01074* (2013.01); *H01L 2924/0455* (2013.01); *H01L 2924/0469* (2013.01); *H01L 2924/04541* (2013.01); *H01L 2924/04941* (2013.01); *H01L 2924/04953* (2013.01); *H01L 2924/0509* (2013.01)

(58) Field of Classification Search
CPC ... H01L 2224/0401; H01L 2224/05088; H01L 2224/05147
See application file for complete search history.

(56) References Cited

U.S. PATENT DOCUMENTS

2020/0103943 A1\* 4/2020 Huang ................. H01L 21/822

\* cited by examiner

*Primary Examiner* — Dale E Page
*Assistant Examiner* — Wilner Jean Baptiste
(74) *Attorney, Agent, or Firm* — Muncy, Geissler, Olds & Lowe, PC

(57) ABSTRACT

The present application discloses a semiconductor device with slanted conductive layers and a method for fabricating the semiconductor device with the slanted conductive layers. The semiconductor device includes a substrate, a first insulating layer positioned above the substrate, first slanted conductive layers positioned in the first insulating layer, and a top conductive layer positioned covering the first slanted conductive layers.

13 Claims, 29 Drawing Sheets

SEMICONDUCTOR DEVICE WITH SLANTED CONDUCTIVE LAYERS AND METHOD FOR FABRICATING THE SAME

TECHNICAL FIELD

The present disclosure relates to a semiconductor device and a method for fabricating the semiconductor device, and more particularly, to a semiconductor device with slanted conductive layers and a method for fabricating the semiconductor device with the slanted conductive layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first insulating layer positioned above the substrate, first slanted conductive layers positioned in the first insulating layer, and a top conductive layer positioned covering the first slanted conductive layers.

In some embodiments, acute angles between bottom surfaces of the first slanted conductive layers and sidewalls of the first slanted conductive layers are between about 10 degree and about 85 degree.

In some embodiments, the first slanted conductive layers are arranged in a grid dot pattern in a top-view perspective.

In some embodiments, the first slanted conductive layers are arranged in a diagonal dot pattern in a top-view perspective.

In some embodiments, the top conductive layer is a conductive line and is formed of copper, aluminum, titanium, tungsten, or a combination thereof.

In some embodiments, the semiconductor device includes a barrier layer positioned between the first insulating layer and the first slanted conductive layers, between the top conductive layer and the first insulating layer, and between the first slanted conductive layers and the substrate. The barrier layer is formed of titanium, titanium nitride, titanium silicon nitride, tantalum, tantalum nitride, tantalum silicon nitride, or a combination thereof.

In some embodiments, a thickness of the barrier layer is between about 10 angstroms and about 15 angstroms.

In some embodiments, the top conductive layer is a solder unit and is formed of a material including tin, silver, copper, gold, alloy or a combination thereof.

In some embodiments, the semiconductor device includes an under bump metallization layer positioned between the first insulating layer and the first slanted conductive layers, between the top conductive layer and the first insulating layer, and between the first slanted conductive layers and the substrate. The under bump metallization layer includes titanium, titanium-tungsten, chromium, aluminum, copper, nickel, chromium-copper, or nickel-vanadium.

In some embodiments, the semiconductor device includes second slanted conductive layers positioned in the first insulating layer, wherein the top conductive layer is positioned covering the first slanted conductive layers and the second slanted conductive layers.

In some embodiments, acute angles between bottom surfaces of the second slanted conductive layers and sidewalls of the second slanted conductive layers are between about −10 degree and about −85 degree.

In some embodiments, the first slanted conductive layers extend along a first direction, the second slanted conductive layers extend along a second direction, and the second direction is different from the first direction.

In some embodiments, the first slanted conductive layers and the second slanted conductive layers are alternatively arranged along a first axis and a second axis in a top-view perspective and the first axis and the second axis are perpendicular to each other.

In some embodiments, the first slanted conductive layers are arranged along a first set of rows, the second slanted conductive layers are arranged along a second set of rows, and the first set of rows and the second set of rows are alternatively arranged.

Another aspect of the present disclosure provides a method for fabricating a semiconductor device including providing a substrate, forming a first insulating layer above the substrate, forming first slanted recesses along the first insulating layer, and forming first slanted conductive layers in the first slanted recesses and a top conductive layer covering the first slanted conductive layers.

In some embodiments, the step of forming the first slanted recesses along the first insulating layer includes forming a first hard mask layer on the first insulating layer, forming first hard mask openings along the first hard mask layer, performing a first slanted etch process on the first insulating layer to form the first slanted recesses along the first insulating layer, and removing the first hard mask layer. The first slanted etch process uses the first hard mask layer as a pattern guide.

In some embodiments, an angle of incidence of the first slanted etch process is between about 5 degree and about 80 degree.

In some embodiments, the first hard mask layer is formed of a material having etch selectivity to the first insulating layer.

In some embodiments, the first hard mask layer is formed of silicon oxide, silicon nitride, silicon oxynitride, silicon nitride oxide, boron nitride, silicon boron nitride, phosphorus boron nitride, boron carbon silicon nitride, or a carbon film.

In some embodiments, an etch rate ratio of the first hard mask layer to the first insulating layer is between about 1:10 and about 1:100 for the first slanted etch process.

Due to the design of the semiconductor device of the present disclosure, the first slanted conductive layers may provide more contact surface to the substrate. Therefore, the electrical characteristics of the semiconductor device may be improved. That is, the performance of the semiconductor device may be improved. In addition, the narrower first slanted recesses may be formed using first hardmask layer having wider first hard mask openings. In other words, the requirements of photolithography process for forming the narrower first slanted recesses may be alleviated. As a result, the yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
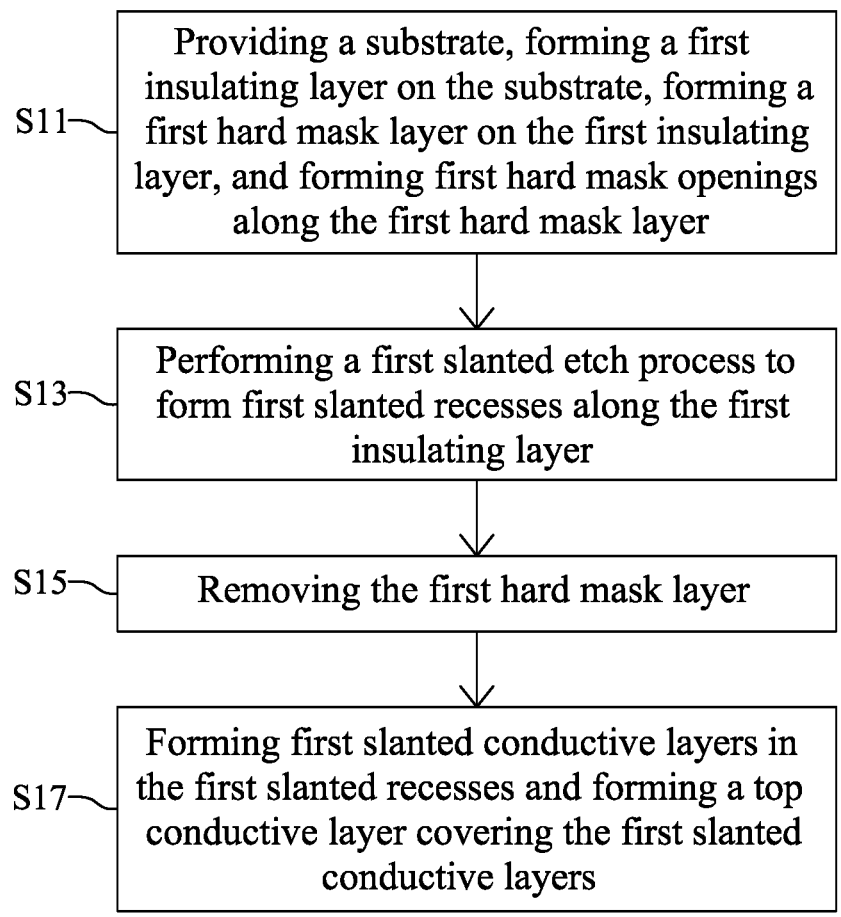
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the axis Z, and below (or down) corresponds to the opposite direction of the arrow of the axis Z.

Figure 2:
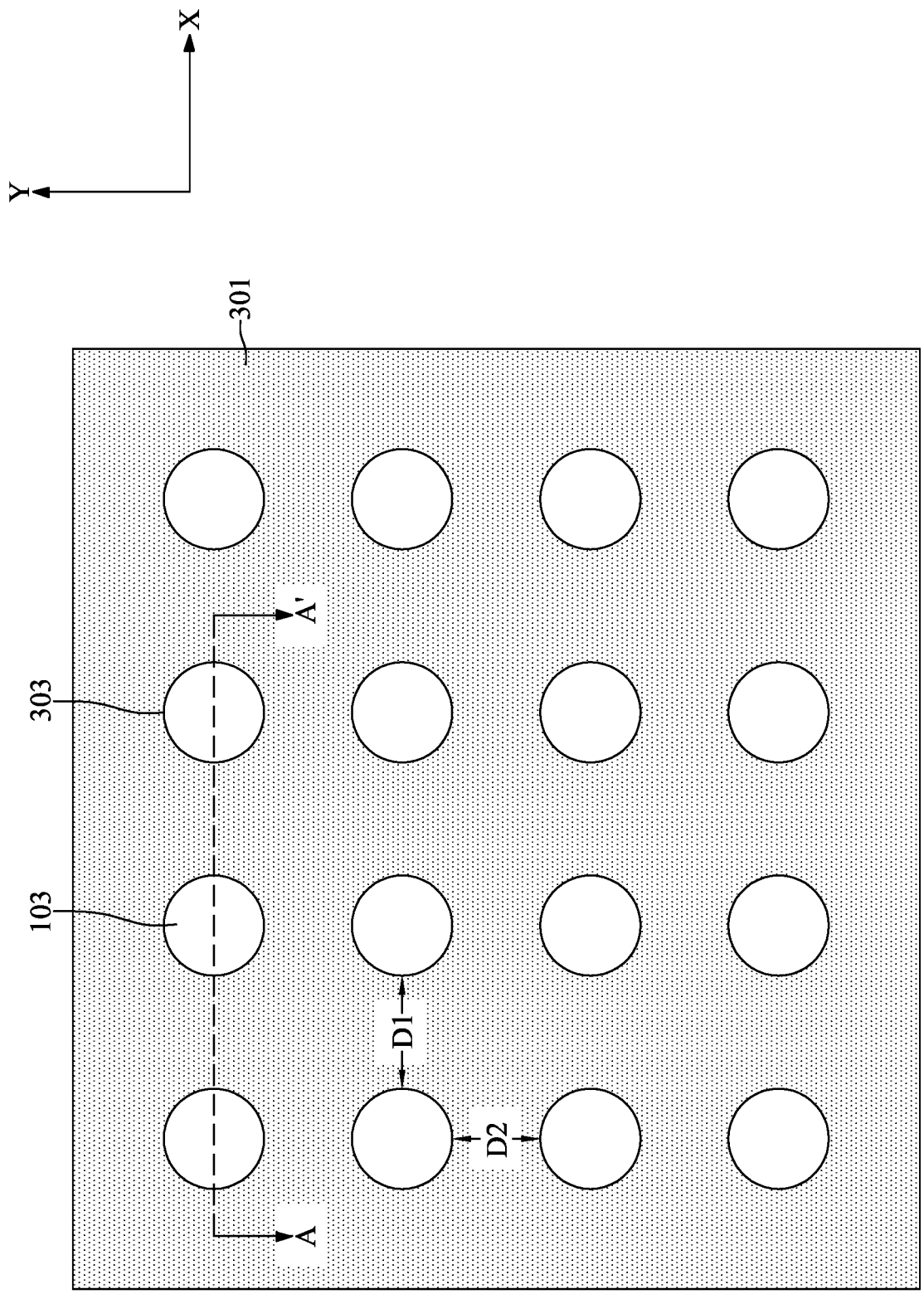
FIG. 2 illustrates, in a schematic top-view diagram, an intermediate semiconductor device in accordance with one embodiment of the present disclosure.
Figure 3:
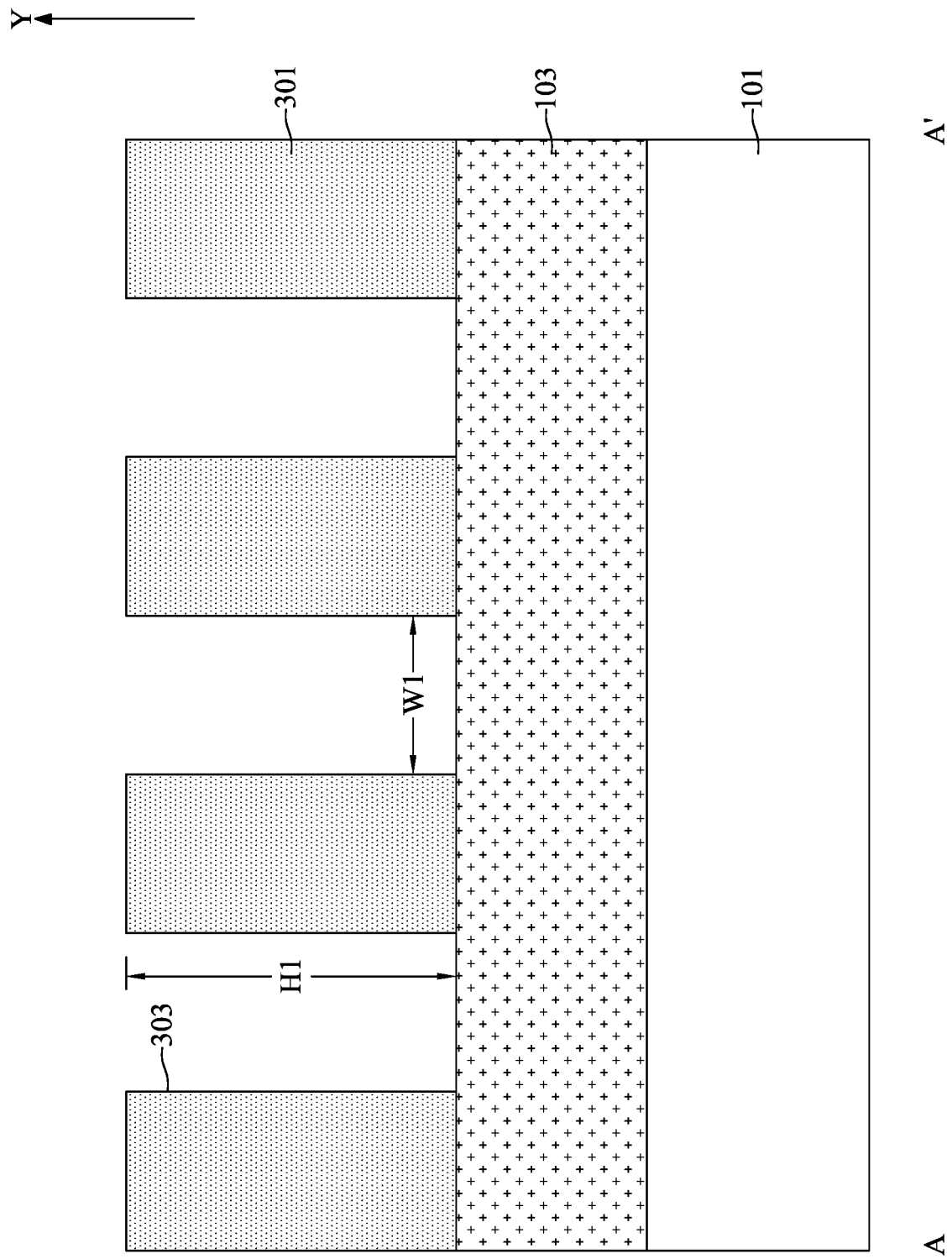
FIG. 3 is a schematic cross-sectional view diagram taken along a line A-A' in FIG. 2 in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2 in accordance with one embodiment of the present disclosure.

With reference to FIGS. 1 to 3, at step S11, a substrate 101 may be provided, a first insulating layer 103 may be formed on the substrate 101, a first hard mask layer 301 may be formed on the first insulating layer 103, and first hard mask openings 303 may be formed along the first hard mask layer 301.

With reference to FIGS. 2 and 3, in some embodiments, the substrate 101 may include a semiconductor-on-insulator structure which consisting of, from bottom to top, a handle substrate, an insulator layer, and a topmost semiconductor layer. The handle substrate and the topmost semiconductor layer may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof. The insulator layer may be a crystalline or non-crystalline dielectric material such as an oxide and/or nitride. The insulator layer may have a thickness between about 10 nm and 200 nm.

In some embodiments, the substrate 101 may include dielectrics, insulating layers, or conductive features formed on the topmost semiconductor layer. The dielectrics or the insulating layers may include, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, amorphous fluorinated carbon, or combinations thereof. The conductive features may be conductive lines, conductive vias, conductive contacts, or the like. The dielectrics or the insulating layers may act as an insulator that supports and electrically isolates the conductive features.

In some embodiments, device elements (not shown) may be formed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIGS. 2 and 3, in some embodiments, the first insulating layer 103 may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, low-k dielectric material, or a combination thereof.

In some embodiments, the first insulating layer 103 may be formed of, for example, silicon oxide, silicon nitride, silicon oxynitride, silicon oxide nitride, polyimide, polybenzoxazole, phosphosilicate glass, undoped silica glass, or fluoride silicate glass. The first insulating layer 103 may be referred to as a passivation layer.

In some embodiments, the first insulating layer 103 may include a bottom passivation layer (not shown for clarity) and a top passivation layer (not shown for clarity). The bottom passivation may be formed on the substrate 101. The top passivation layer may be formed on the bottom passivation layer. The bottom passivation layer may be formed of, for example, silicon oxide or phosphosilicate glass. The top passivation layer may be formed of, for example, silicon nitride, silicon oxynitride, or silicon oxide nitride. The bottom passivation layer may serve as a stress buffer between the top passivation layer and the substrate 101. The top passivation layer may serve as a high vapor barrier in order to prevent moisture from entering from above.

In some embodiments, the first insulating layer 103 may be formed of a material different from the first hard mask layer 301. Specifically, the first insulating layer 103 may be formed of a material having etch selectivity to the first hard mask layer 301.

With reference to FIGS. 2 and 3, in some embodiments, the first hardmask layer 301 may be formed of, for example, silicon oxide, silicon nitride, silicon oxynitride, silicon nitride oxide, the like, or a combination thereof. The first hard mask layer 301 may be formed by a deposition process such as chemical vapor deposition, plasma enhanced chemical vapor deposition, low pressure chemical vapor deposition, or the like.

It should be noted that, in description of the present disclosure, silicon oxynitride refers to a substance which contains silicon, nitrogen, and oxygen and in which a proportion of oxygen is greater than that of nitrogen, Silicon nitride oxide refers to a substance which contains silicon, oxygen, and nitrogen and in which a proportion of nitrogen is greater than that of oxygen.

Alternatively, in some embodiments, the first hard mask layer 301 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. These terms do include, for example, graphite, charcoal and halocarbons.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof. In some embodiments, partially or completely fluorinated derivatives of the hydrocarbon compounds may be used. The doped derivatives include boron-containing derivatives of the hydrocarbon compounds as well as fluorinated derivatives thereof.

In some embodiments, the carbon film may be deposited from the processing gas mixture by maintaining a substrate temperature between about 100° C. and about 700° Q specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance properties, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch selectivity and chemical mechanical polishing resistance properties. As the hydrogen content decreases, the etch resistance, and thus the selectivity, of the carbon film increases. The reduced rate of removal of the carbon film may make the carbon film suitable for being a mask layer when performing an etch process to transfer desire pattern onto the underlying layers.

Alternatively, in some embodiments, the first hard mask layer 301 may be formed of, for example, boron nitride, silicon boron nitride, phosphorus boron nitride, or boron carbon silicon nitride. In some embodiments, the first hard mask layer 301 may be formed with an assistant of a plasma process, an UV cure process, a thermal anneal process, or a combination thereof. A substrate temperature of the formation of the first hard mask layer 301 may be between about 20° C. and about 1000° C. A process pressure of the formation of the first hard mask layer 301 may be between about 10 mTorr and about 760 Torr.

When the first hard mask layer 301 is formed with the assistant of the plasma process. Plasma of the plasma process may be provided by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz.

When the first hard mask layer 301 is formed with the assistant of UV cure process, the UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV; specifically, between about 1 eV and about 6 eV. The assistant of the UV cure process may remove hydrogen from the first hard mask layer 301. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the first hard mask layer 301.

With reference to FIGS. 2 and 3, the first hard mask openings 303 may be formed along the first hard mask layer 301. Portions of the first insulating layer 103 may be exposed through the first hard mask openings 303. In a top-view perspective, the first hard mask openings 303 may be arranged in a grid dot pattern. The first hard mask openings 303 may be equidistantly disposed along a first axis X and a second axis Y. The first axis X and the second axis Y are perpendicular to each other. Specifically, the distance D1 between an adjacent pair of the first hard mask openings 303 along the first axis X may be equal to the distance D2 between an adjacent pair of the first hard mask openings 303 along the second axis Y. In a cross-sectional perspective, a ratio of the width W1 of the first hard mask openings 303 to the height H1 of the first hard mask openings 303 may be between about 5:1 and about 1:15, between about 3:1 and about 1:13, between about 1:1 and about 1:11, and between about 5:1 and about 1:8.

Figure 4:
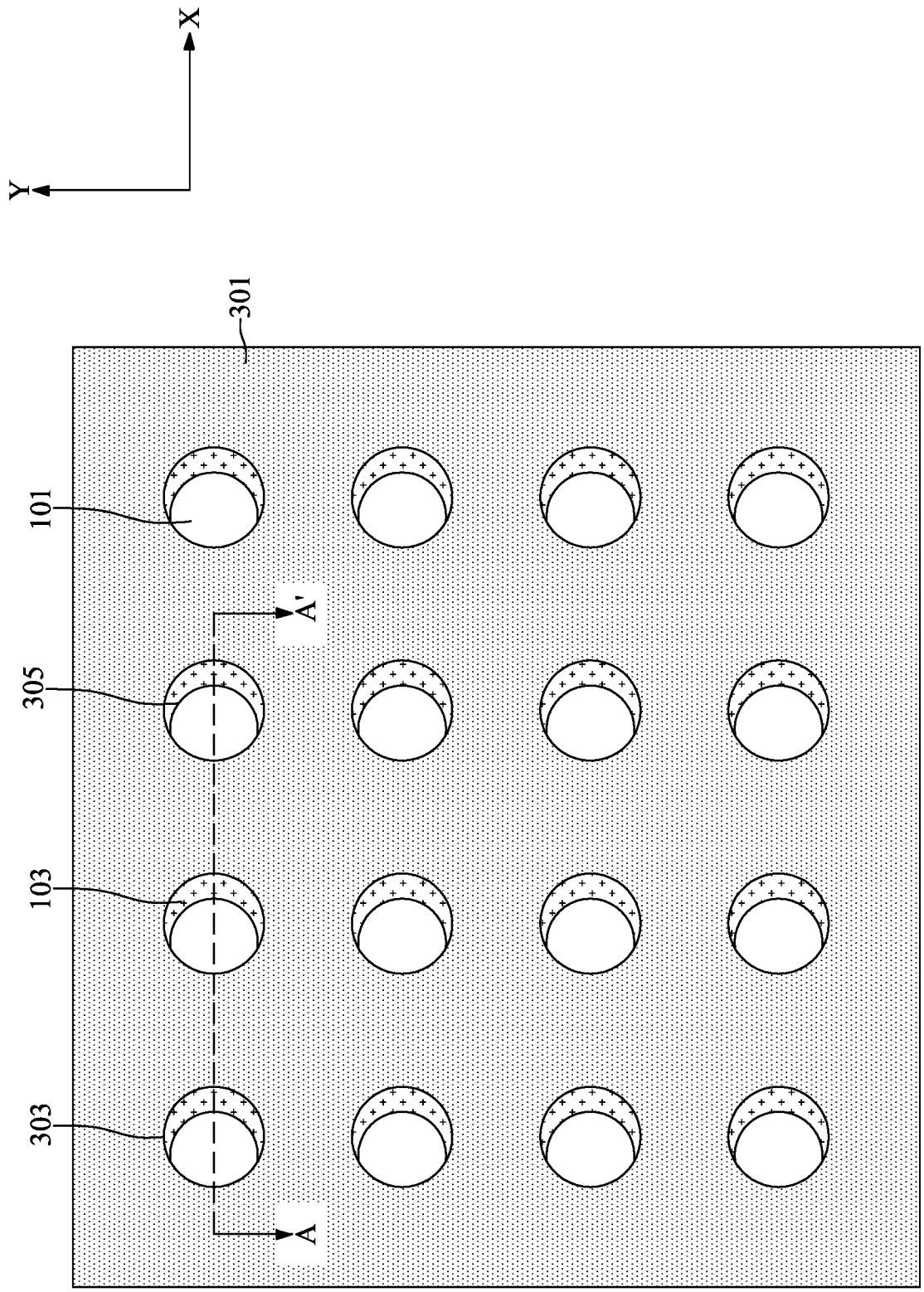
FIG. 4 illustrates, in a schematic top-view diagram, an intermediate semiconductor device in accordance with one embodiment of the present disclosure.
Figure 5:
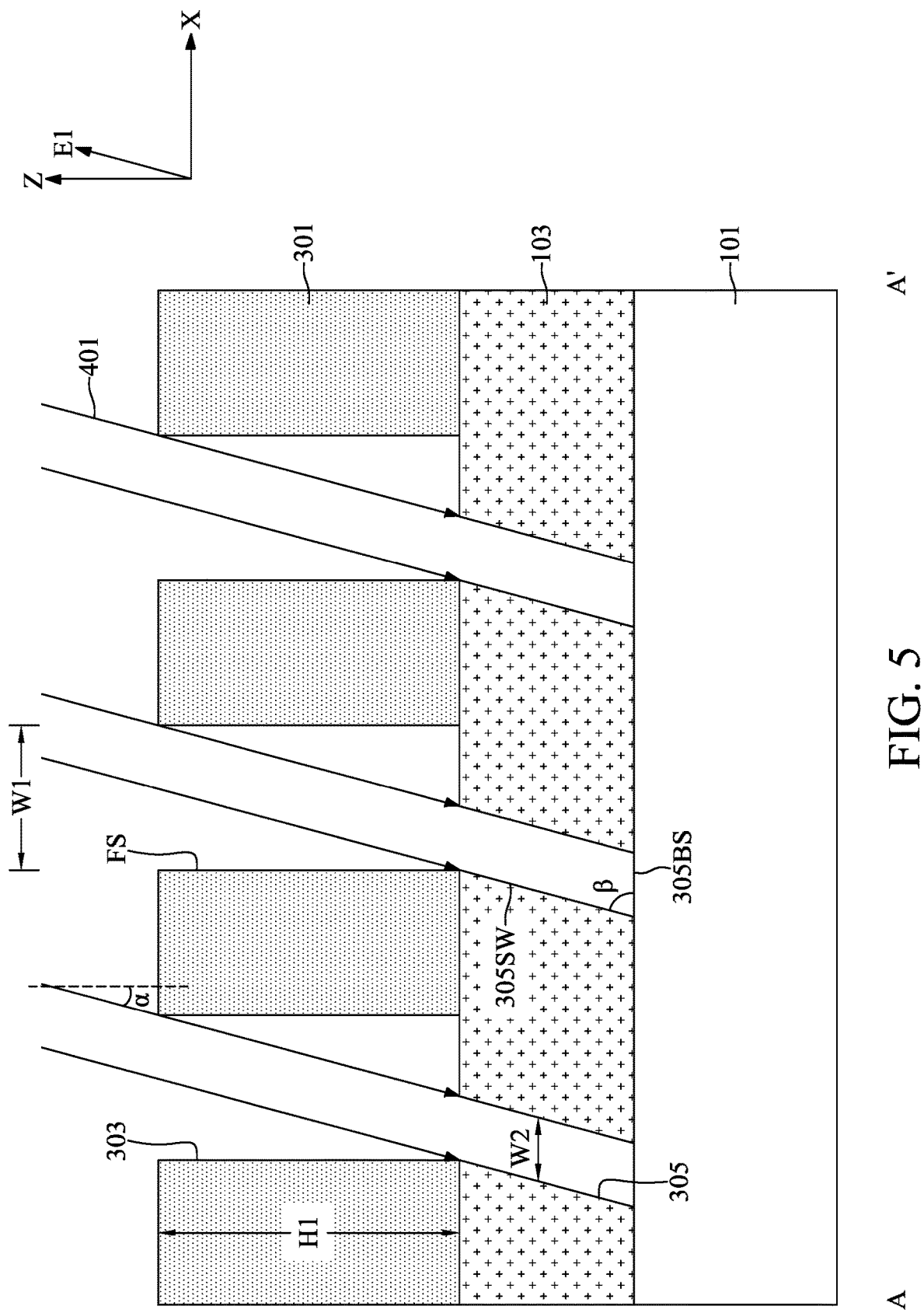
FIG. 5 is a schematic cross-sectional view diagram taken along a line A-A' in FIG. 4 in accordance with one embodiment of the present disclosure.

FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4 in accordance with one embodiment of the present disclosure.

With reference to FIGS. 1, 4, and 5, at step S13, a first slanted etch process 401 may be performed to form first slanted recesses 305 along the first insulating layer 103.

With reference to FIGS. 4 and 5, the first slanted etch process 401 may use the first hard mask layer 301 as pattern guides to remove portions of the first insulating layer 103 and concurrently form the first slanted recesses 305 along the first insulating layer 103. The first slanted recesses 305 may be formed adjacent to the first sides FS of the first hard mask layer 301 in a cross-sectional perspective.

In some embodiments, the angle of incidence α of the first slanted etch process 401 may be define by the width W1 of the first hard mask openings 303 and the height H1 of the first hard mask openings 303.

In some embodiments, the angle of incidence α of the first slanted etch process 401 may be between about 5 degree and about 80 degree. In some embodiments, the angle of incidence α of the first slanted etch process 401 may be between about 20 degree and about 60 degree. In some embodiments, the angle of incidence α of the first slanted etch process 401 may be between about 20 degree and about 40 degree.

In some embodiments, the first slanted etch process 401 may be an anisotropic etch process such as a reactive ion etching process. The reactive ion etching process may include etchant gases and passivation gases which may suppress the isotropic effect to limit the removal of material in the horizontal direction. The etchant gases may include chlorine gas and boron trichloride. The passivation gases may include fluoroform or other suitable halocarbons. In some embodiments, the first hard mask layer 301 formed of carbon film may serve as a halocarbon source for the passivation gases of the reactive ion etching process.

In some embodiments, the etch rate of the first insulating layer 103 of the first slanted etch process 401 may be faster than the etch rate of the first hard mask layer 301 of the first slanted etch process 401. For example, an etch rate ratio of the first insulating layer 103 to the first hard mask layer 301 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the first slanted etch process 401.

With reference to FIGS. 4 and 5, the width W2 of the first slanted recesses 305 may be less than the width W1 of the first hard mask openings 303. The acute angles β between the bottom surfaces 305BS of the first slanted recesses 305 and the sidewalls 305SW of the first slanted recesses 305 may be between about 10 degree and about 85 degree, between about 20 degree and about 80 degree, between about 45 degree and about 80 degree, between about 60 degree and about 80 degree, and between about 70 degree and about 80 degree. In some embodiments, the first slanted recesses 305 may be extended in a first direction E1. The first direction E1 may be slanted with respect to the axis Z and the first axis X.

Figure 6:
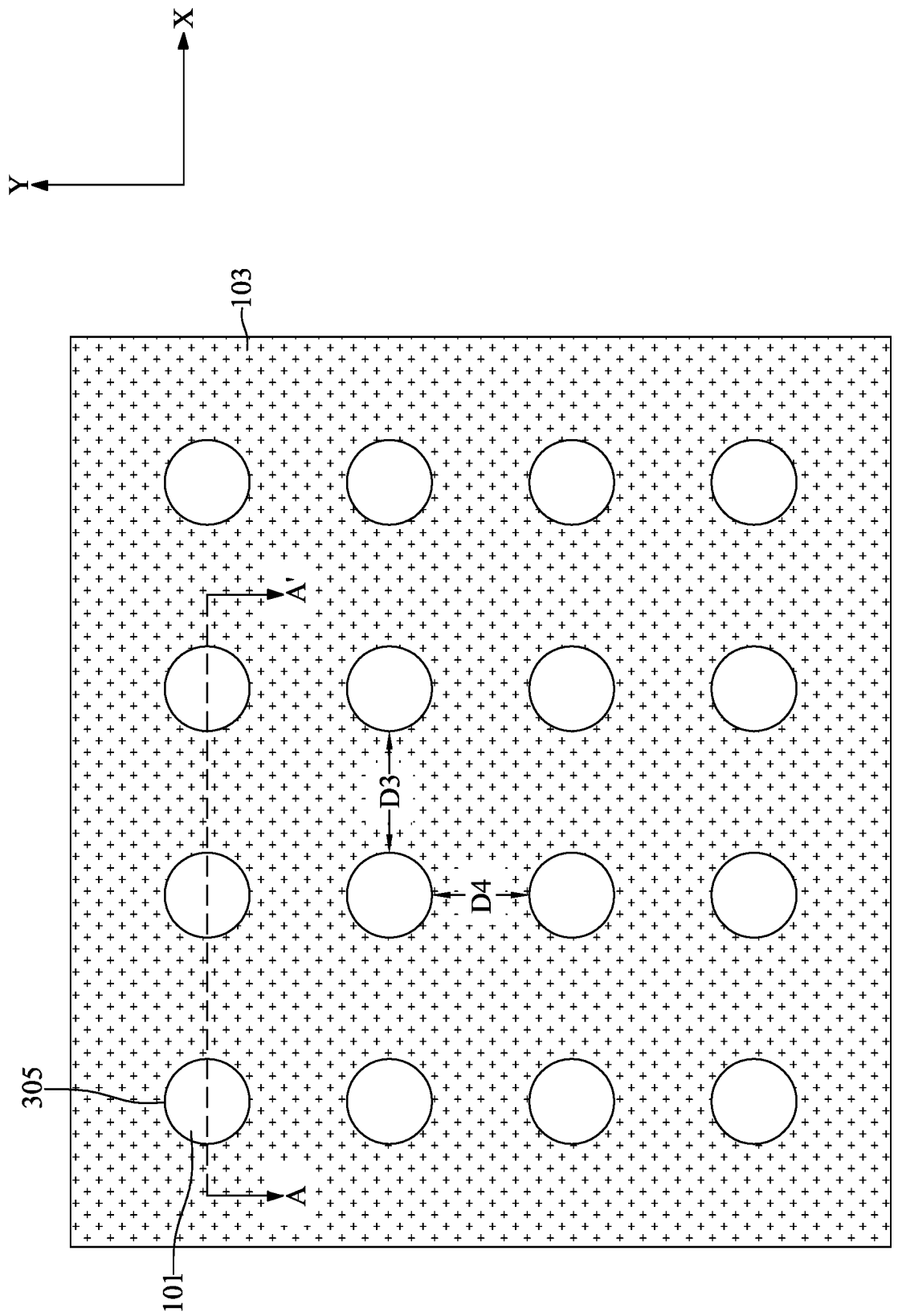
FIG. 6 illustrates, in a schematic top-view diagram, an intermediate semiconductor device in accordance with one embodiment of the present disclosure.
Figure 7:
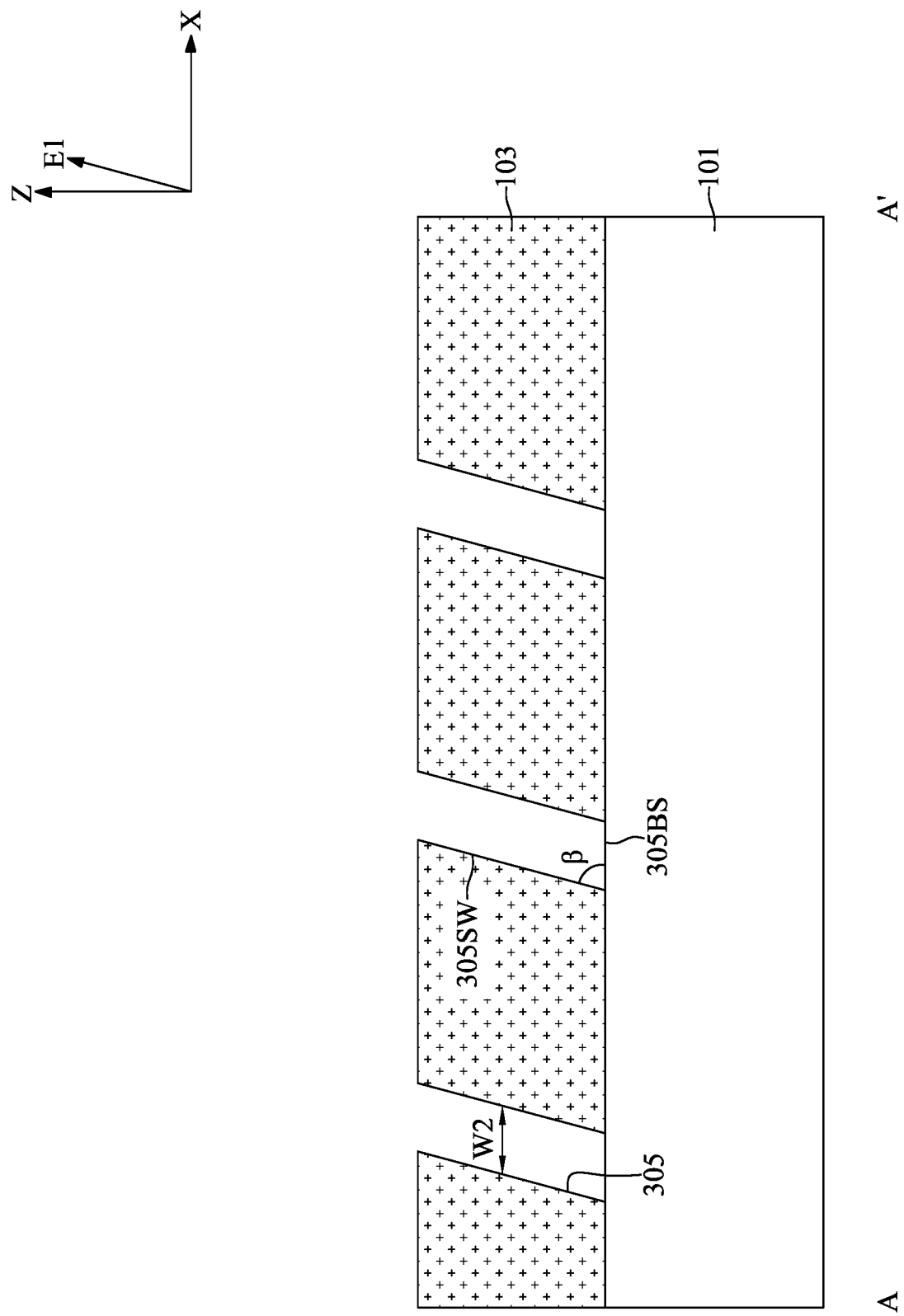
FIGS. 7 to 9 are schematic cross-sectional view diagrams taken along a line A-A' in FIG. 6 in accordance with one embodiment of the present disclosure.
Figure 8:
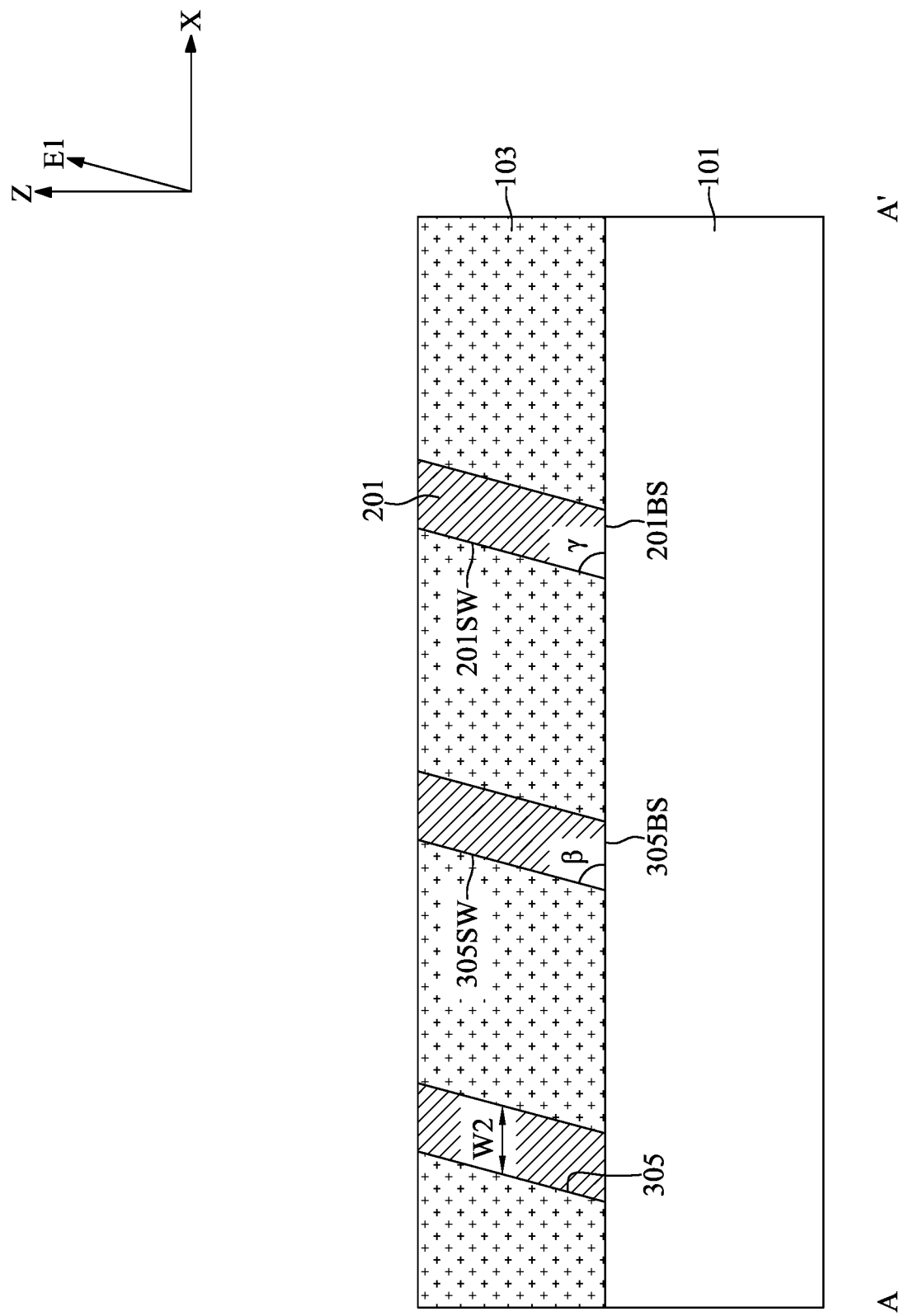
Figure 9:
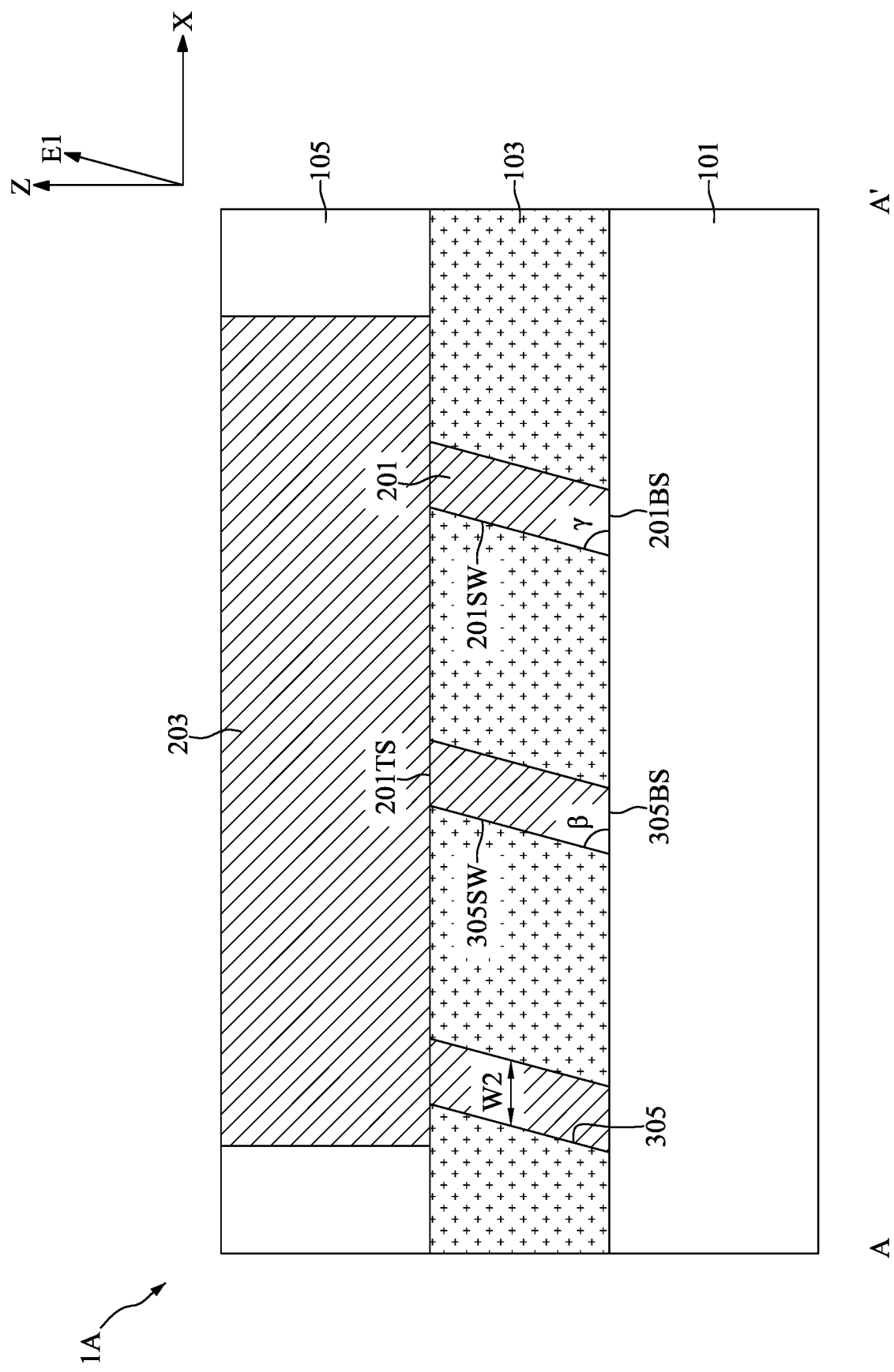

FIG. 6 illustrates, in a schematic top-view diagram, an intermediate semiconductor device in accordance with one embodiment of the present disclosure. FIGS. 7 to 9 are schematic cross-sectional view diagrams taken along a line A-A' in FIG. 6 in accordance with one embodiment of the present disclosure. Some elements are not shown in FIG. 6 for clarity.

With reference to FIGS. 1, 6, and 7, at step S15, the first hard mask layer 301 may be removed.

With reference to FIGS. 6 and 7, the first hard mask layer 301 may be removed by a hard mask etch process. The hard mask etch process may be an anisotropic dry etch process or a wet etch process. In some embodiments, the etch rate of the first hard mask layer 301 of the hard mask etch process may be faster than the etch rate of the first insulating layer 103 of the hard mask etch process. For example, an etch rate ratio of the first hard mask layer 301 to the first insulating layer 103 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process.

With reference to FIG. 6, in a top-view perspective, the first slanted recesses 305 may be arranged in a grid dot pattern. The first slanted recesses 305 may be equidistantly disposed along the first axis X and the second axis Y. Specifically, the distance D3 between an adjacent pair of the first slanted recesses 305 along the first axis X may be equal to the distance D4 between an adjacent pair of the first slanted recesses 305 along the second axis Y. Portions of the substrate 101 may be exposed through the first slanted recesses 305.

In some embodiments, a cleaning process and a passivation process may be performed on the first slanted recesses 305 after the removal of the first hard mask layer 301. The cleaning process may remove oxide, originating from oxidation by oxygen in the air, from the top surface of the topmost conductive feature in the substrate 101 without damaging the topmost conductive feature in the substrate 101. The cleaning process may include applying a mixture of hydrogen and argon as a remote plasma source onto the first slanted recesses 305. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device after the cleaning process with a precursor such as dimethylaminotrimethylsilane, tetramethylsilane, or the like at a process temperature between about 200° C. and about 400° C. An ultraviolet radiation may be used to facilitate the passivation process. The passivation process may passivate the sidewalls of the first insulating layer 103 exposed through the first slanted recesses 305 by sealing surface pores thereof. Undesirable sidewall growth, which may affect the electric characteristics of the semiconductor device 1A, may be reduced by the passivation process. As a result, the performance and reliability of the semiconductor device 1A may be increased.

With reference to FIGS. 1, 8, and 9, at step S17, first slanted conductive layers 201 may be formed in the first slanted recesses 305 and a top conductive layer 203 may be formed covering the first slanted conductive layers 201.

With reference to FIG. 8, the first slanted conductive layers 201 may be formed to completely fill the first slanted recesses 305 and cover the top surface of the first insulating layer 103. In some embodiments, the first slanted conductive layers 201 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The first slanted conductive layers 201 may be formed by a deposition process such as physical vapor deposition, chemical vapor deposition, atomic layer deposition, or sputtering. A planarization process, such as chemical mechanical polishing, may be performed until the top surface of the first insulating layer 103 is exposed to remove excess material and provide a substantially flat surface for subsequent processing steps.

With reference to FIG. 8, in a cross-sectional perspective, the shape of the first slanted conductive layers 201 may be defined by the first slanted recesses 305. That is, the acute angles γ between the bottom surfaces 201BS of the first slanted conductive layers 201 and the sidewalls 201SW of the first slanted conductive layers 201 may be between about 10 degree and about 85 degree, between about 20 degree and about 80 degree, between about 45 degree and about 80 degree, between about 60 degree and about 80 degree, and between about 70 degree and about 80 degree. In some embodiments, the first slanted conductive layers 201 may be extended in the first direction E1.

With reference to FIG. 9, a second insulating layer 105 may be formed on the first insulating layer 103. The second insulating layer 105 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The second insulating layer 105 may be formed by deposition processes such as chemical vapor deposition, plasma enhanced chemical vapor deposition, evaporation, or spin-on coating.

With reference to FIG. 9, the top conductive layer 203 may be formed in the second insulating layer 105 and covering the top surfaces 201TS of the first slanted conductive layers 201. In some embodiments, the top conductive layer 203 may be formed of, for example, copper, aluminum, titanium, tungsten, the like, or a combination thereof. The top conductive layer 203 may be formed by a damascene process. The first slanted conductive layers 201 may be referred to as conductive vias of the semiconductor device 1A and the top conductive layer 203 may be referred to as a conductive line of the semiconductor device 1A.

Figure 10:
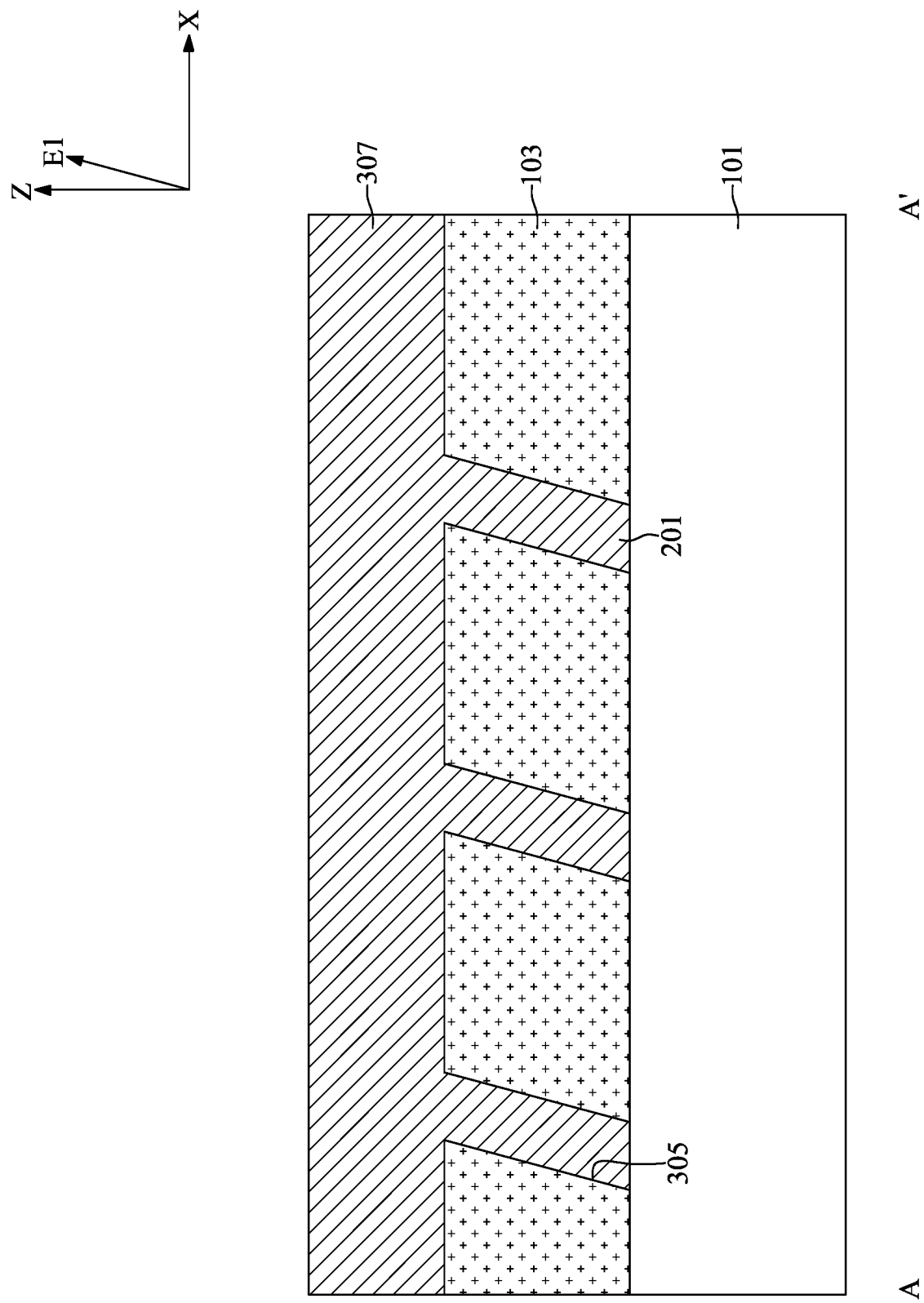
FIGS. 10 to 15 are schematic cross-sectional view diagrams taken along a line A-A' in FIG. 6 in accordance with some embodiments of the present disclosure.
Figure 11:
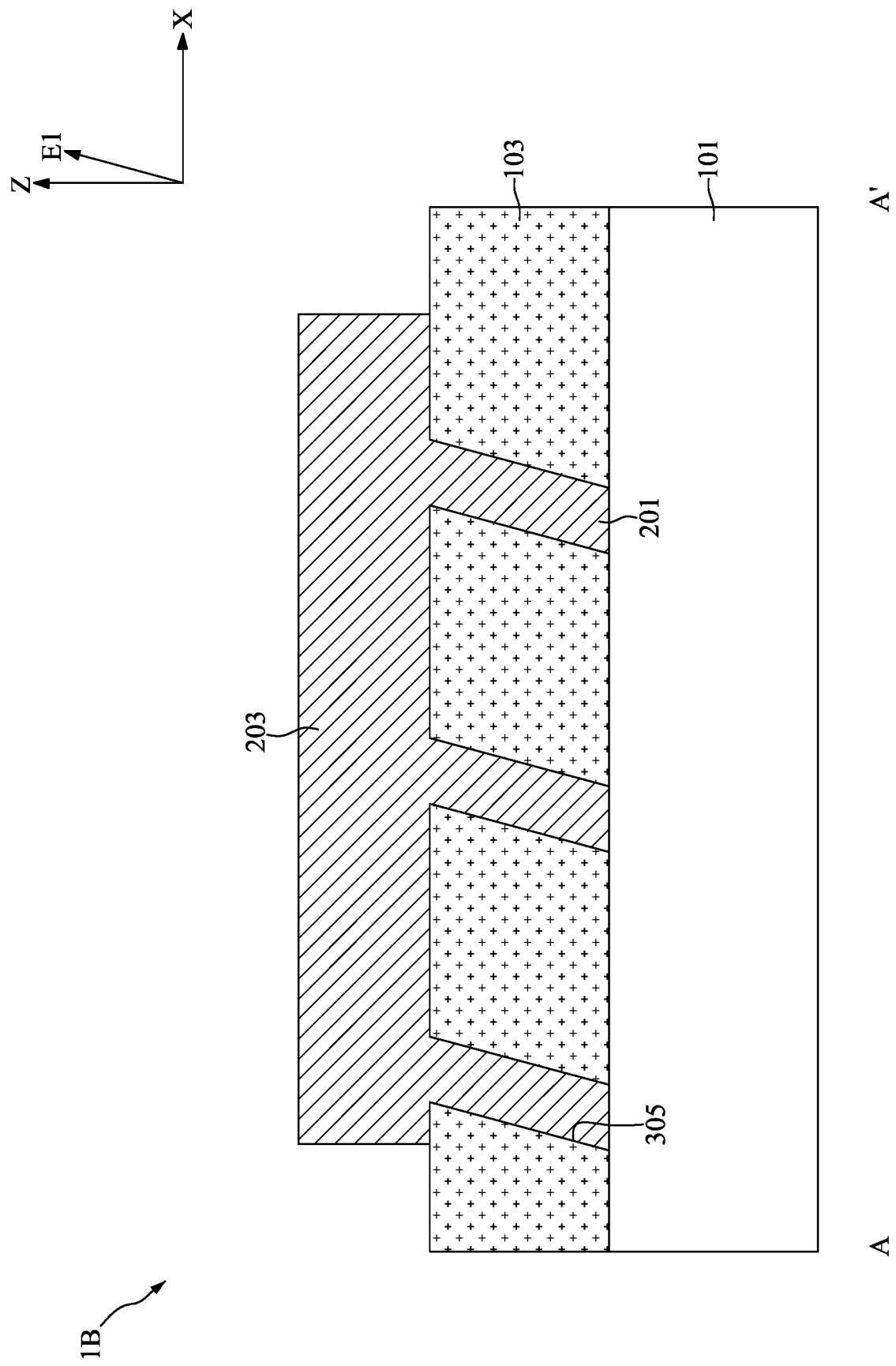

FIGS. 10 and 11 are schematic cross-sectional view diagrams taken along a line A-A' in FIG. 6 in accordance with another embodiment of the present disclosure.

With reference to FIG. 10, for fabrication of a semiconductor device 1B, an intermediate semiconductor device may be fabricating with a procedure similar to that illustrated in FIGS. 2 to 7. A layer of first conductive material 307 may completely fill the first slanted recesses 305 and cover the top surface of the first insulating layer 103. The first conductive material 307 may be aluminum, copper, aluminum-copper alloy, aluminum alloy, or copper alloy. The layer of first conductive material 307 may be formed by a deposition process such as physical vapor deposition, chemical vapor deposition, or sputtering. A planarization process, such as chemical mechanical polishing, may be performed to provide a substantially flat surface for subsequent processing steps. The layer of first conductive material 307 filled in the first slanted recesses 305 may be referred to as conductive vias of the semiconductor device 1B.

With reference to FIG. 11, a photolithography process may be performed to define a desire pattern for the layer of first conductive material 307. An etch process may be subsequently performed to remove portions of the layer of first conductive material 307 and concurrently form the top conductive layer 203 with the desire pattern. The top conductive layer 203 may be referred to as a pad layer of the semiconductor device 1B.

Figure 12:
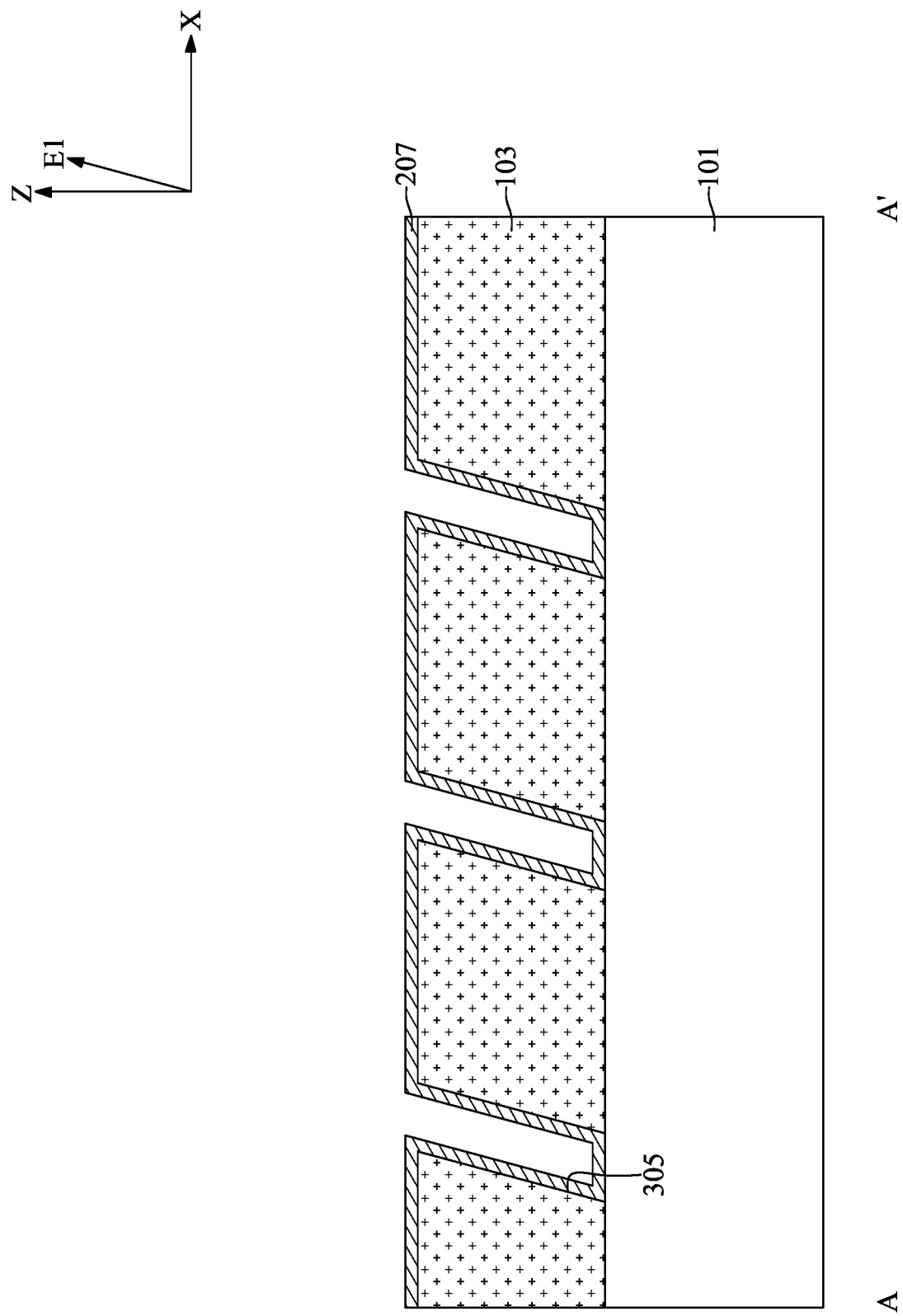
Figure 13:
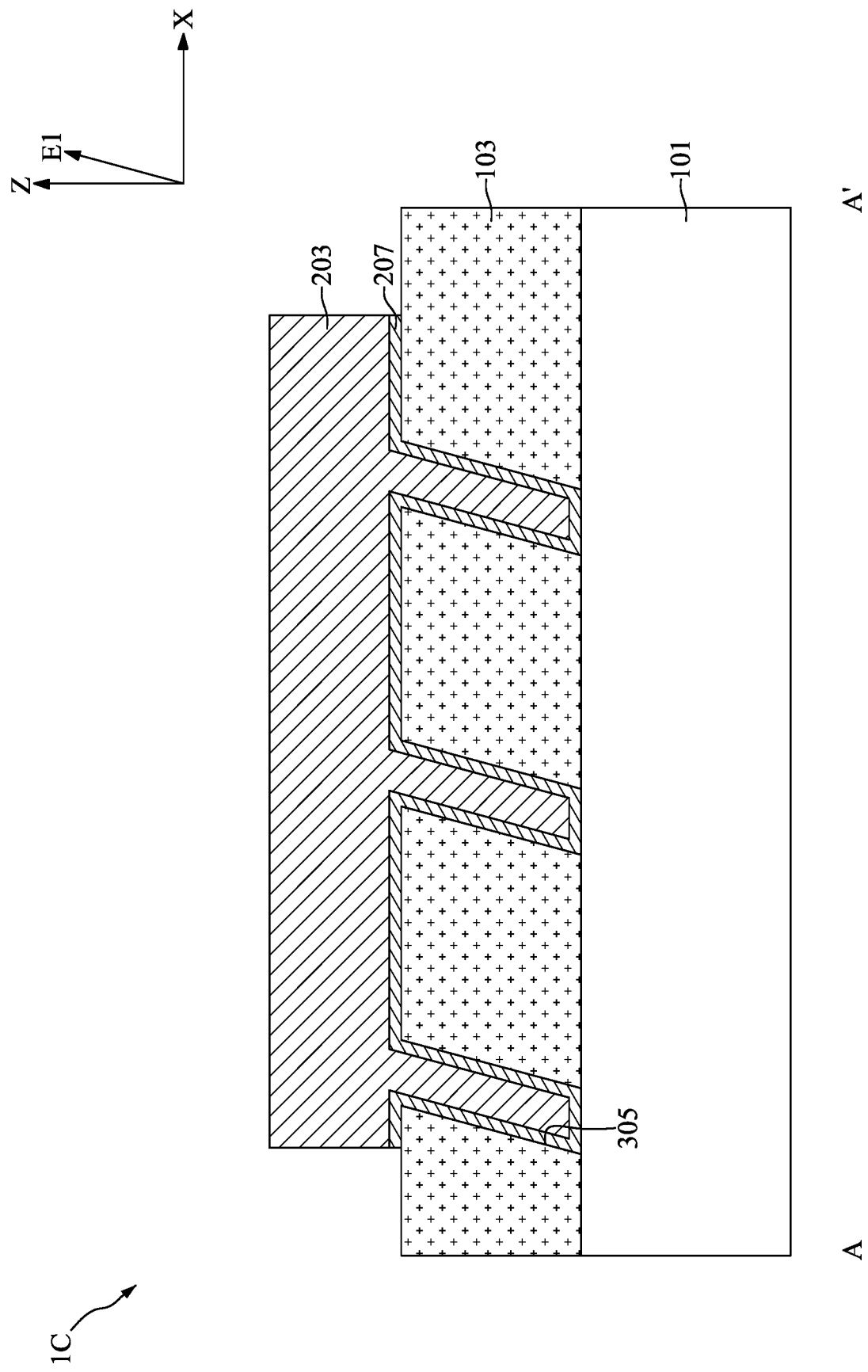

FIGS. 12 and 13 are schematic cross-sectional view diagrams taken along a line A-A' in FIG. 6 in accordance with another embodiment of the present disclosure.

With reference to FIG. 12, for fabrication of a semiconductor device 1C, an intermediate semiconductor device may be fabricating with a procedure similar to that illustrated in FIGS. 2 to 7. A barrier layer 207 may conformally formed in the first slanted recesses 305. The barrier layer 207 may be formed of, for example, titanium, titanium nitride, titanium silicon nitride, tantalum, tantalum nitride, tantalum silicon nitride, or a combination thereof. The barrier layer 207 may be formed by a deposition process such as physical vapor deposition, chemical vapor deposition, atomic layer deposition, or sputtering. In some embodiments, the barrier layer 207 may have a thickness between about 10 angstroms and about 15 angstroms. In some embodiments, the barrier layer 207 may have a thickness between about 11 angstroms and about 13 angstroms.

With reference to FIG. 13, the top conductive layer 203 may be formed on the barrier layer 207 with a procedure similar to that illustrated in FIGS. 10 and 11. The barrier layer 207 may serve as an adhesive layer between the first slanted conductive layers 201 and the topmost conductive line in the substrate 101. The barrier layer 207 may also prevent metal ions of the first slanted conductive layers 201 or the top conductive layer 203 diffusing into the first insulating layer 103 or the substrate 101.

Figure 14:
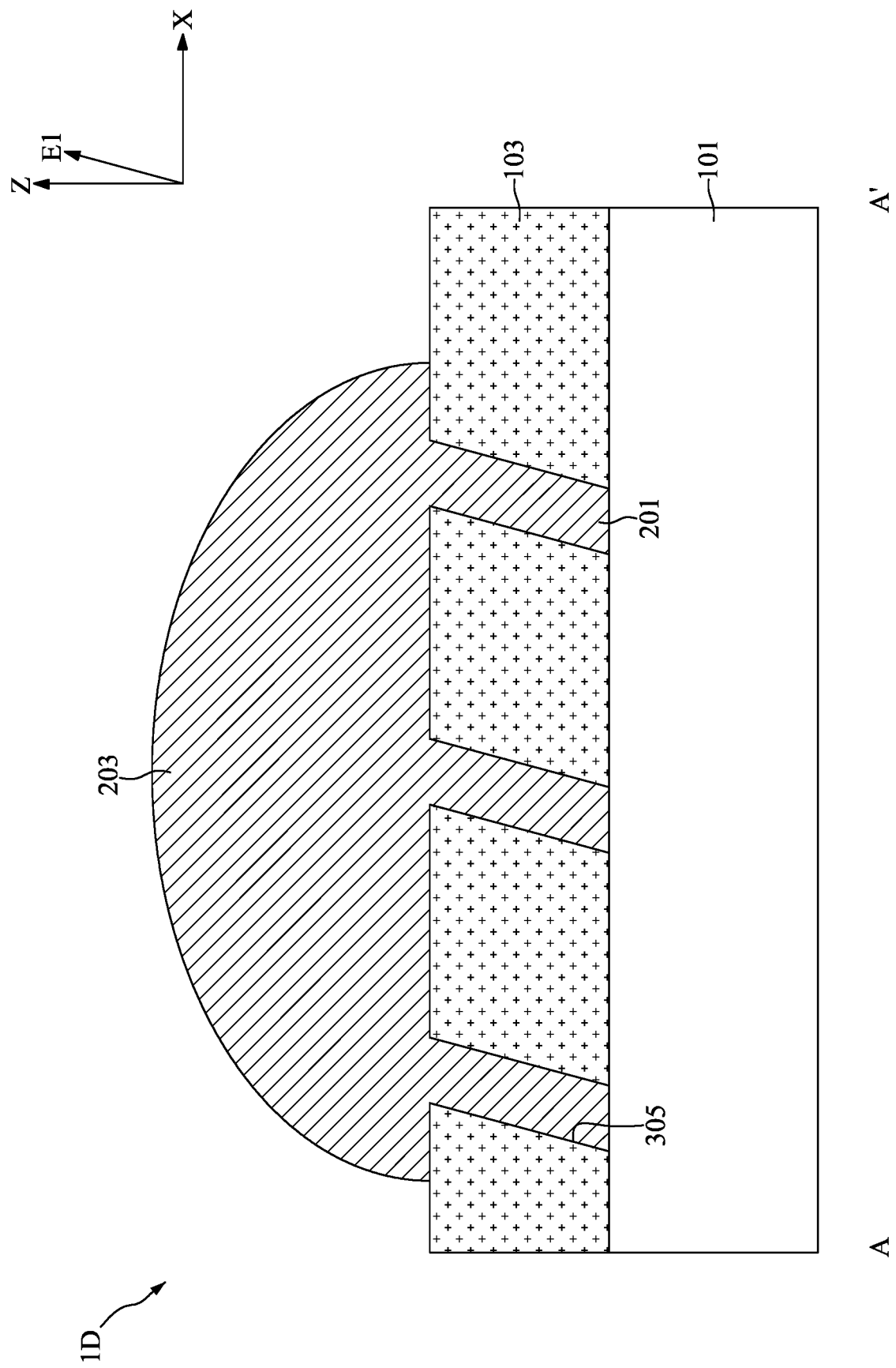

FIG. 14 is a schematic cross-sectional view diagrams taken along a line A-A' in FIG. 6 in accordance with another embodiment of the present disclosure.

With reference to FIG. 14, for fabrication of a semiconductor device 1D, an intermediate semiconductor device may be fabricating with a procedure similar to that illustrated in FIGS. 2 to 7. A top conductive layer 203 may completely fill the first slanted recesses 305 and cover a portion of the top surface of the first insulating layer 103. The top conductive layer 203 may be formed of, for example, a material including tin, silver, copper, gold, alloy or a combination thereof. The top conductive layer 203 may be referred to as a solder unit of the semiconductor device 1D.

During a wiring process, a process of forming a solder unit, or a packaging process, stress may be applied to semiconductor device and the stress may cause delamination of the first insulating layer 103. To reduce the effect of the stress of the aforementioned processes, the first slanted recesses 305 may serve as buffer spaces to reduce the stress of the aforementioned processes, reduce the semiconductor device 1D warpage, and prevent layers underneath the first insulating layer 103 from delaminating.

Figure 15:
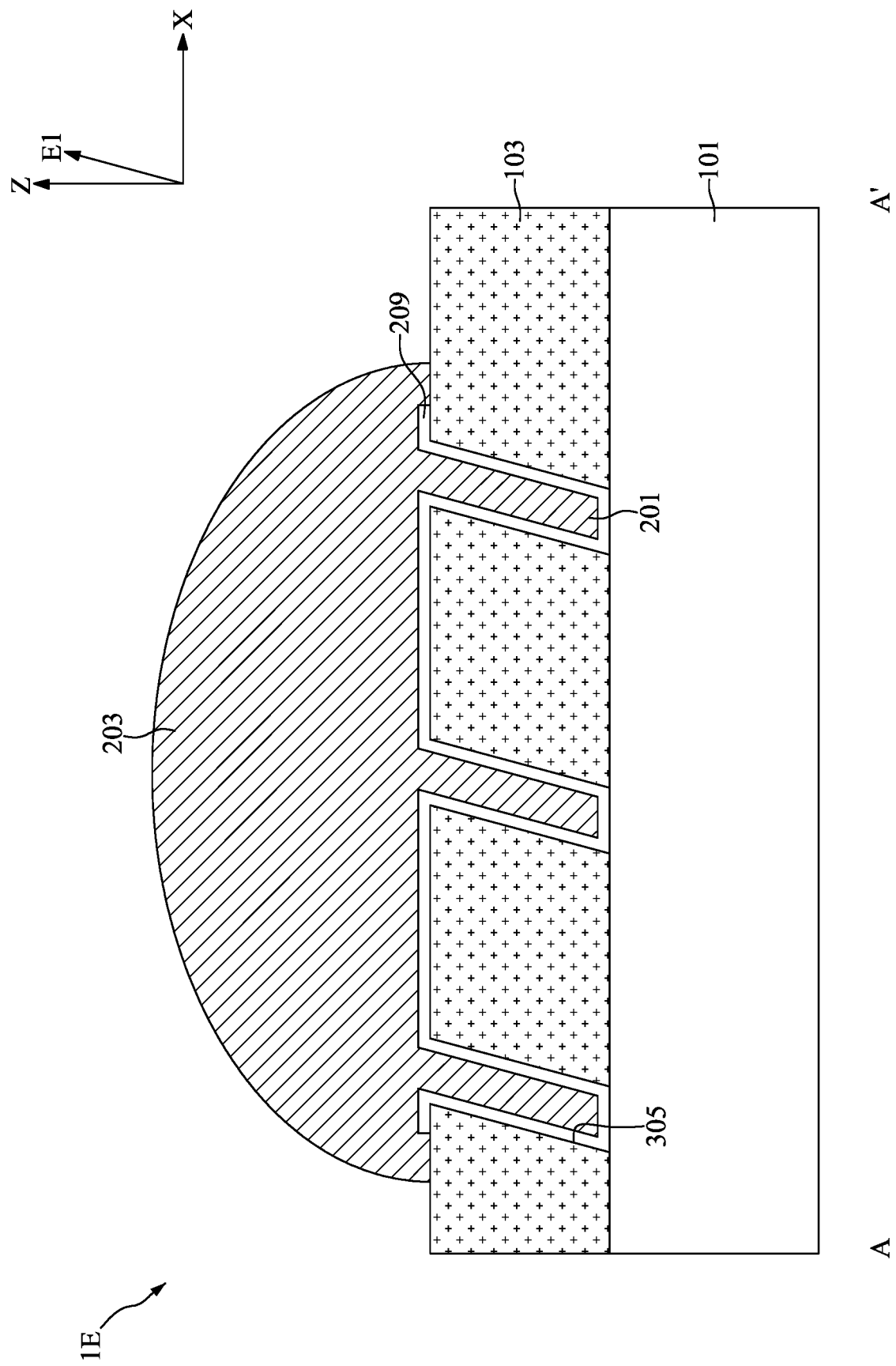

FIG. 15 is a schematic cross-sectional view diagrams taken along a line A-A' in FIG. 6 in accordance with another embodiment of the present disclosure.

With reference to FIG. 15, for fabrication of a semiconductor device 1E, an intermediate semiconductor device may be fabricating with a procedure similar to that illustrated in FIGS. 2 to 7. A under bump metallization layer 209 may be conformally formed in the first slanted recesses 305. The under bump metallization layer 209 may be a single layer structure or a stacked structure of multiple layers. For example, the under bump metallization layer 209 may include a first conductive layer, a second conductive layer, and a third conductive layer stacked sequentially. The first conductive layer may serve as an adhesive layer for stably attaching the top conductive layer 203 to the substrate 101 and the first insulating layer 103. For example, the first conductive layer may include at least one of titanium, titanium-tungsten, chromium, and aluminum. The second conductive layer may serve as a barrier layer for preventing a conductive material contained in the under bump metallization layer 209 from diffusing into the substrate 101 or the first insulating layer 103. The second conductive layer may include at least one of copper, nickel, chromium-copper, and nickel-vanadium. The third conductive layer may serve as a seed layer for forming the top conductive layer 203 or as a wetting layer for improving wetting characteristics of the top conductive layer 203. The third conductive layer may include at least one of nickel, copper, and aluminum. The top conductive layer 203 may be formed with a procedure similar to that illustrated in FIG. 14.

Figure 16:
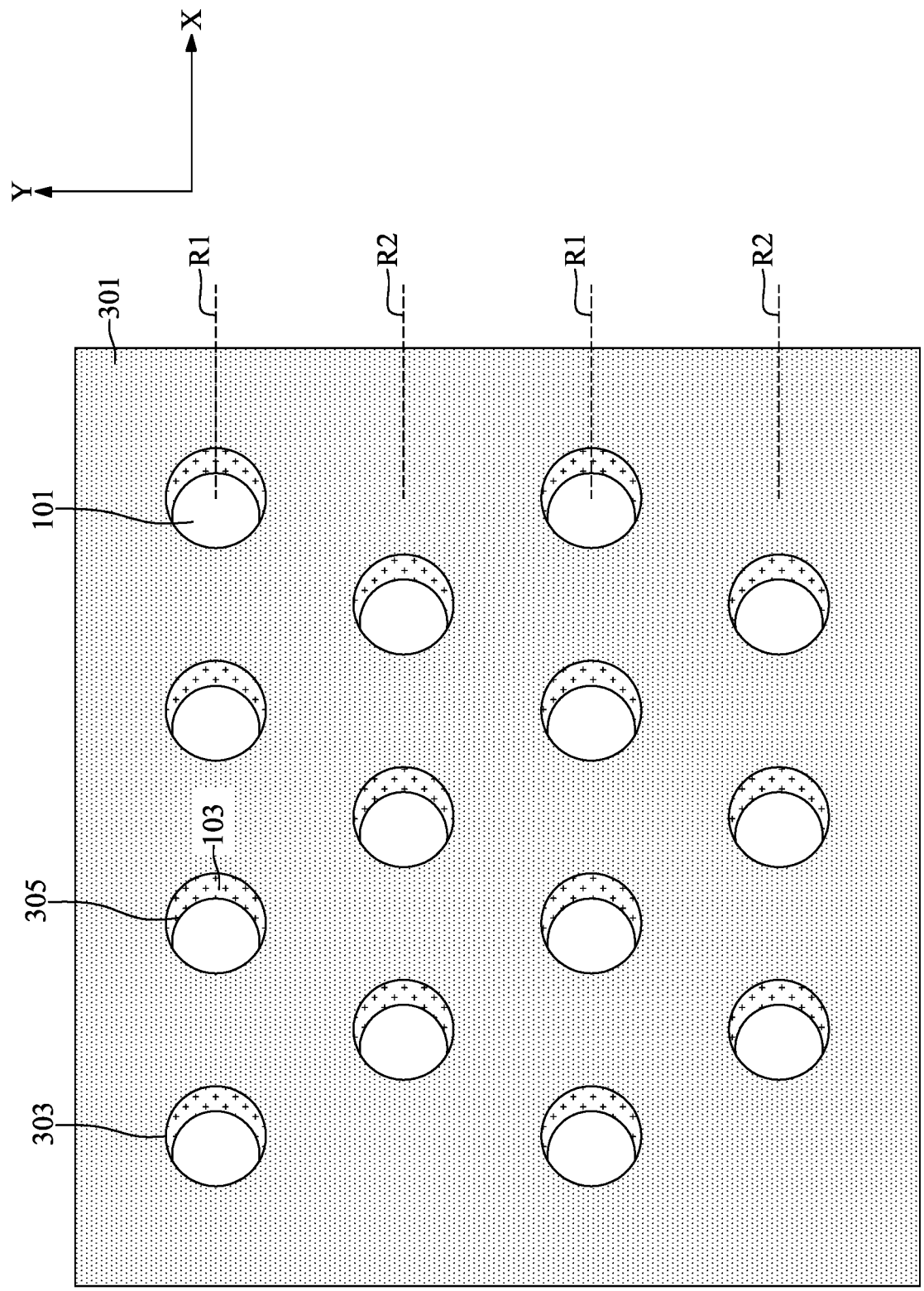
FIGS. 16 and 17 illustrate, in schematic top-view diagrams, intermediate semiconductor devices in accordance with another embodiment of the present disclosure.
Figure 17:
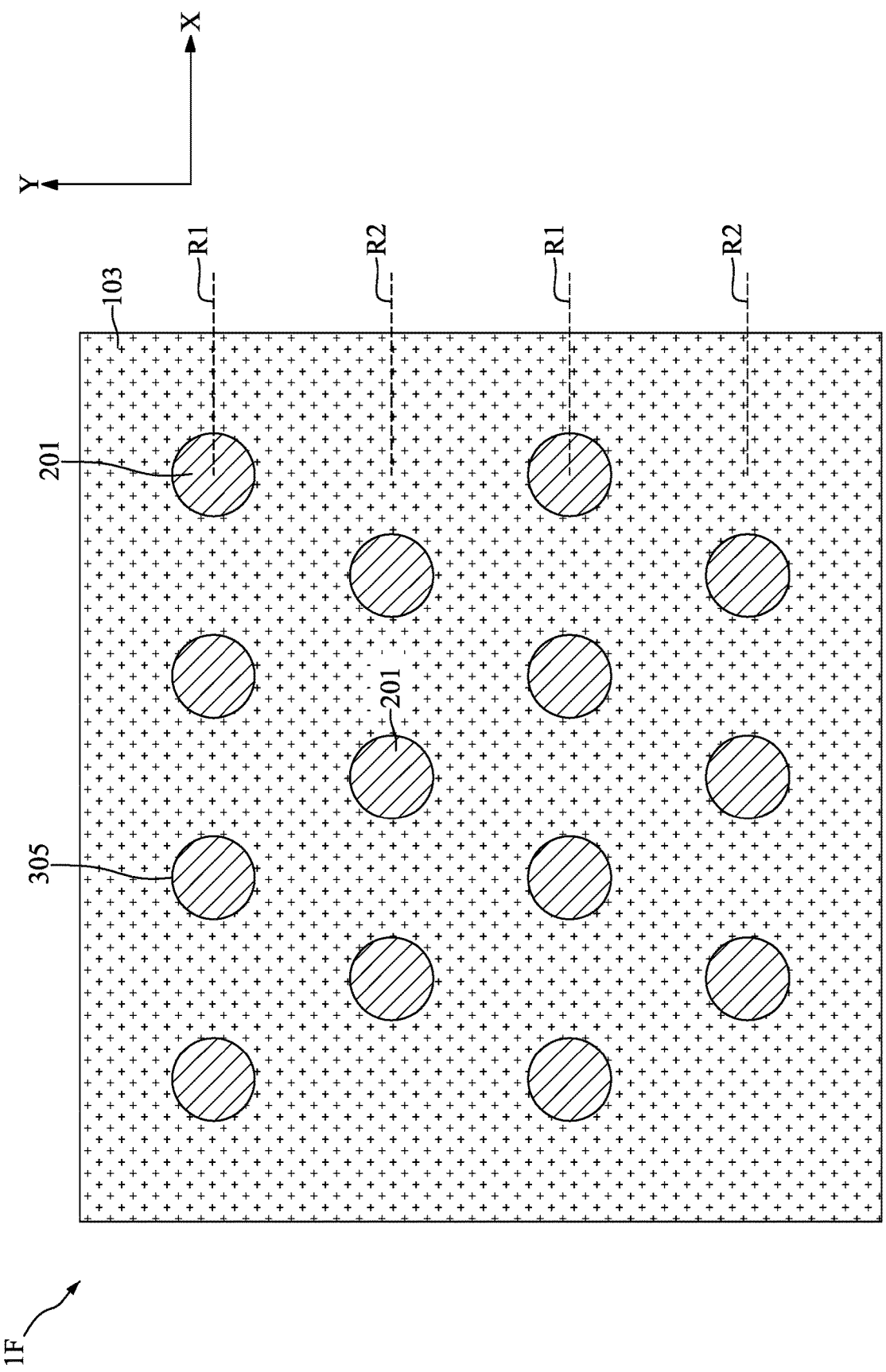

FIGS. 16 and 17 illustrate, in schematic top-view diagrams, intermediate semiconductor devices in accordance with another embodiment of the present disclosure.

With reference to FIG. 16, for fabrication a semiconductor device 1F, an intermediate semiconductor device may be fabricating with a procedure similar to that illustrated in FIGS. 2 to 5. The first hard mask openings 303 may be arranged in a diagonal dot pattern. The first hard mask openings 303 may be categorized into two groups. The first group of the first hard mask openings 303 may be disposed along a first set of rows R1. The second group of the first hard mask openings 303 may be disposed along a second set of rows R2. The first set of rows R1 and the second set of row R2 may be parallel to the first axis X. The first set of rows R1 and the second set of row R2 may be alternatively arranged. With respect to the second axis Y, the first hard mask openings 303 disposed along the second set of rows R2 may offset from the first hard mask openings 303 disposed along the first set of rows R1. Due to the first slanted recesses 305 may be formed using the first hard mask layer 301 and the first hard mask openings 303 as the pattern guides. Therefore, the arrangement of the first slanted recesses 305 may be similar to the arrangement of the first hard mask openings 303.

With reference to FIG. 17, a procedure similar to that illustrated in FIGS. 6 to 8 may be performed to the intermediate semiconductor device illustrated in FIG. 16. Due to the arrangement of the first slanted conductive layers 201 may be defined by the arrangement of the first slanted recesses 305. That is, the first slanted conductive layers 201 may be also arranged in a diagonal dot pattern. Specifically, the first slanted conductive layers 201 may also be categorized into two groups. The first group of the first slanted conductive layers 201 may be disposed along the first set of rows R1. The second group of the first slanted conductive layers 201 may be disposed along the second set of rows R2. The first set of rows R1 and the second set of row R2 may be parallel to the first axis X. The first set of rows R1 and the second set of row R2 may be alternatively arranged. With respect to the second axis Y, the first slanted conductive layers 201 disposed along the second set of rows R2 may offset from the first slanted conductive layers 201 disposed along the first set of rows R1.

The first slanted conductive layers 201 arranged in the diagonal dot pattern may make the distance between any two adjacent first slanted conductive layers 201 maximized. Therefore, the parasitic capacitance among the first slanted conductive layers 201 may be minimized.

Figure 18:
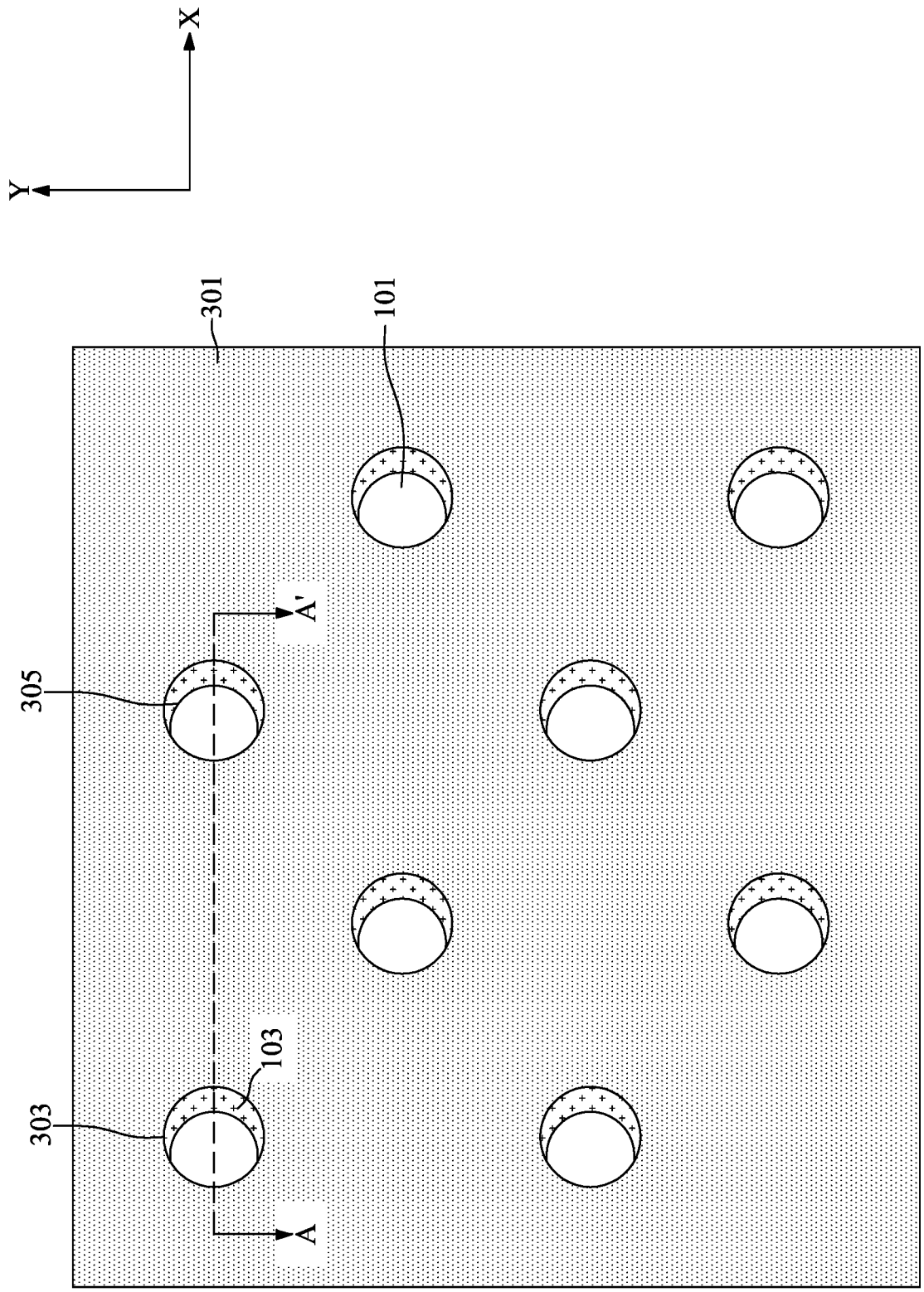
FIG. 18 illustrates, in a schematic top-view diagram, an intermediate semiconductor device in accordance with another embodiment of the present disclosure.
Figure 19:
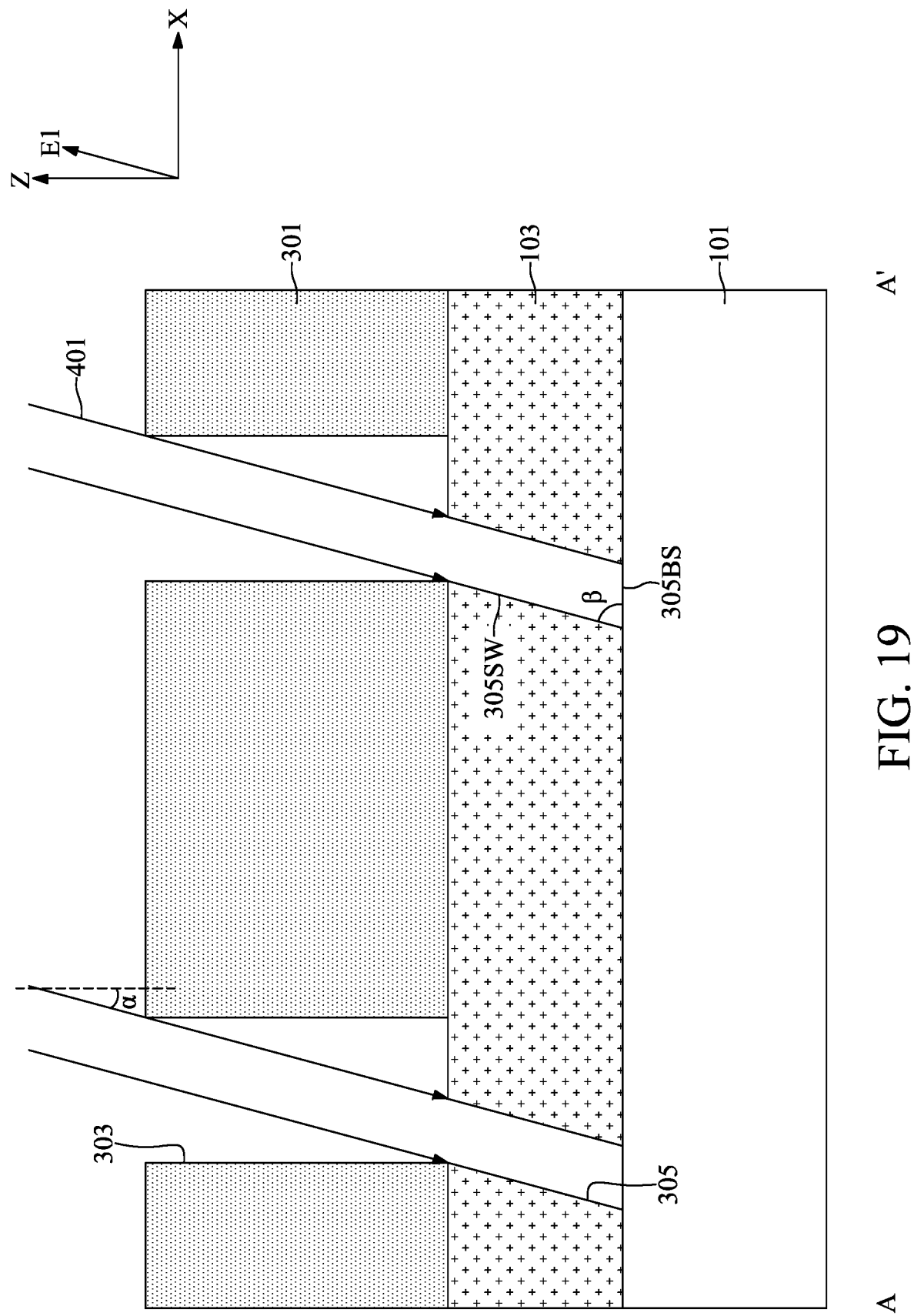
FIG. 19 is a schematic cross-sectional view diagram taken along a line A-A' in FIG. 18 in accordance with another embodiment of the present disclosure.

FIG. 18 illustrates, in a schematic top-view diagram, an intermediate semiconductor device in accordance with another embodiment of the present disclosure. FIG. 19 is a schematic cross-sectional view diagram taken along a line A-A' in FIG. 18 in accordance with another embodiment of the present disclosure.

With reference to FIGS. 18 and 19, for fabrication of a semiconductor device 1G, an intermediate semiconductor device may be fabricating with a procedure similar to that illustrated in FIGS. 2 to 5. In a top-view perspective, the first hard mask openings 303 may be arranged in a diagonal dot pattern and the first slanted recesses 305 may be arranged in a pattern similar to the first hard mask openings 303. In a cross-sectional perspective, the first slanted recesses 305 may have acute angles β similar to that illustrated in FIG. 5 and the first slanted recesses 305 may extended in the first direction E1. After formation of the first slanted recesses 305, the first hard mask layer 301 may be removed.

Figure 20:
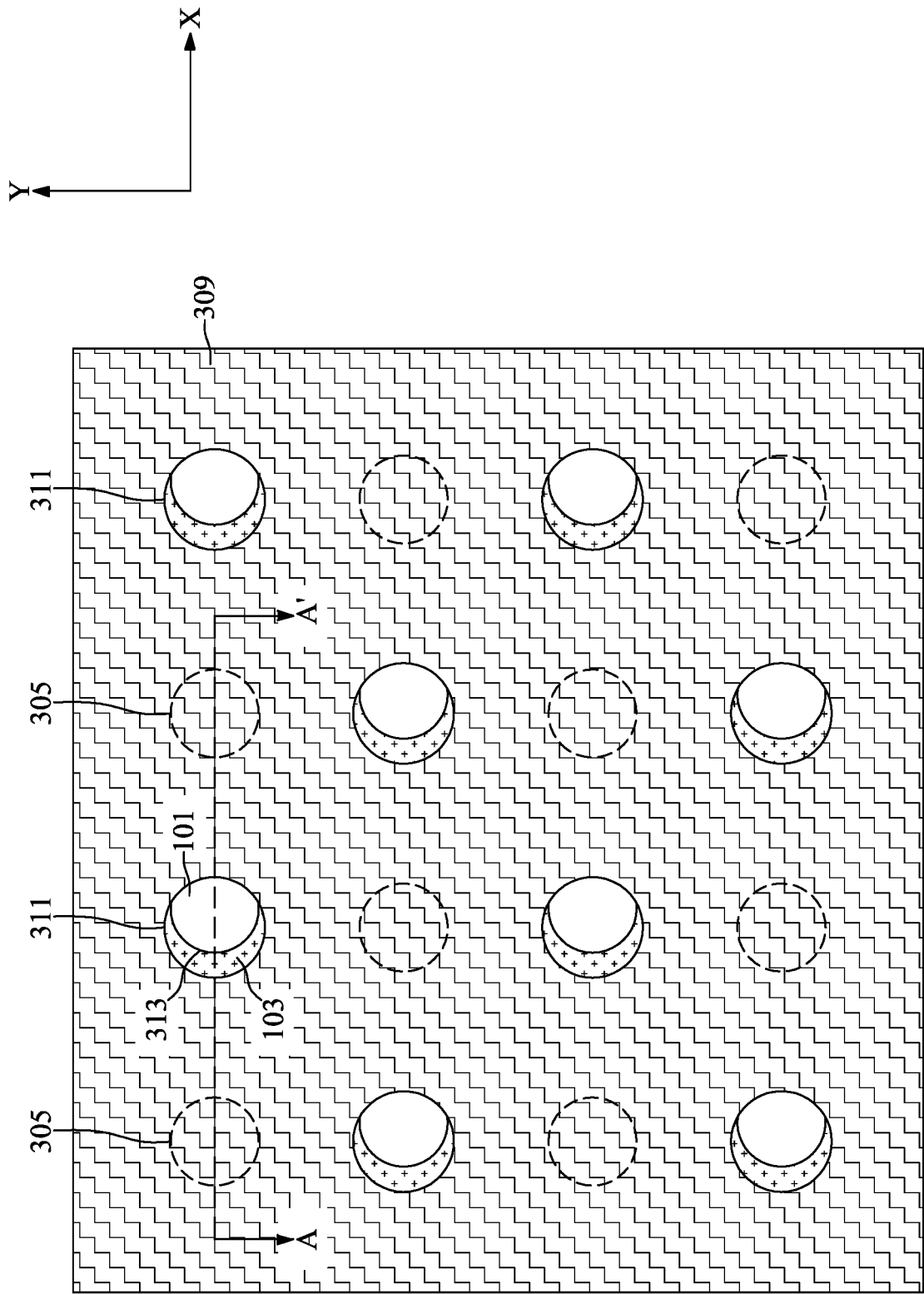
FIG. 20 illustrates, in a schematic top-view diagram, an intermediate semiconductor device in accordance with another embodiment of the present disclosure.
Figure 21:
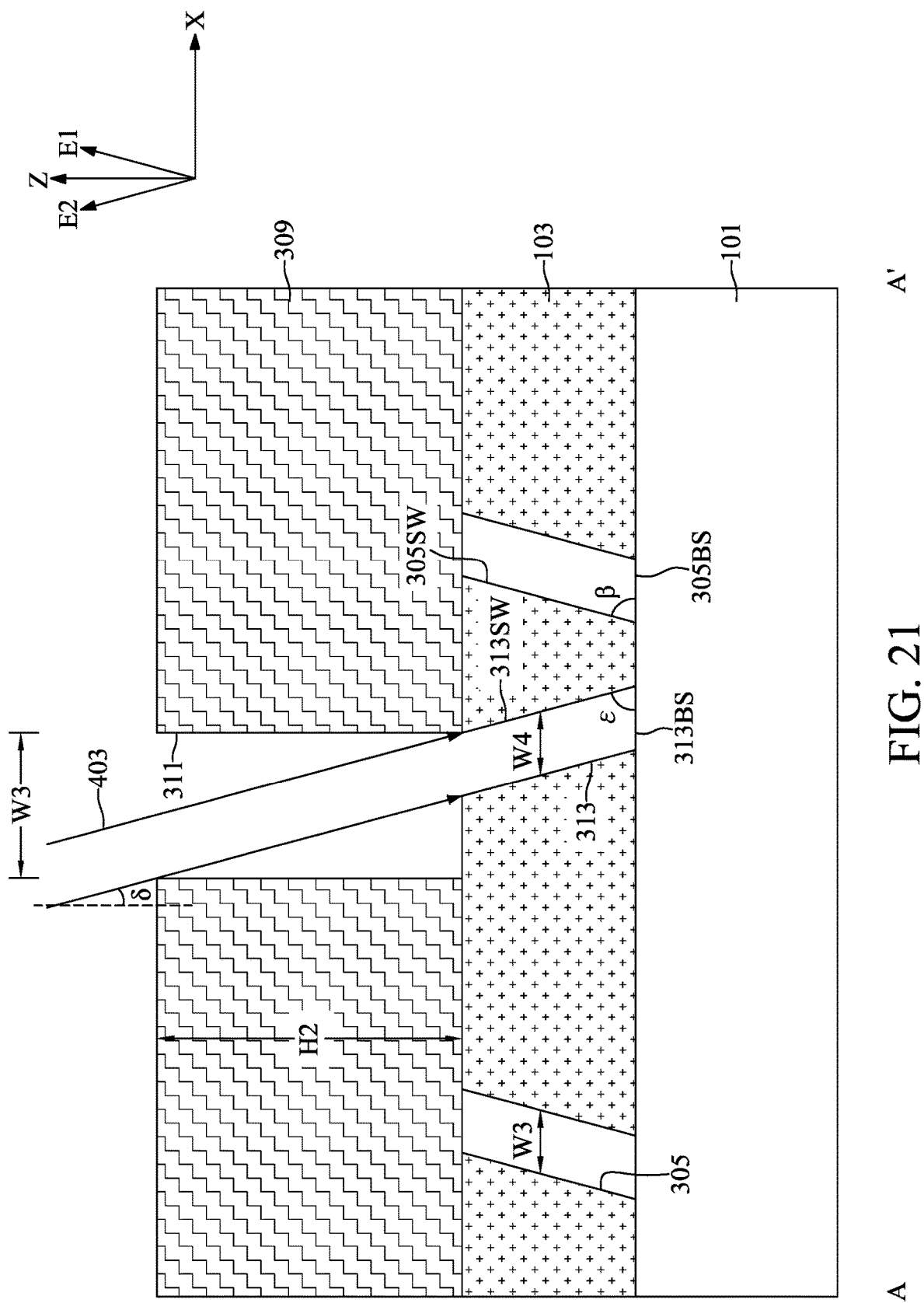
FIG. 21 is a schematic cross-sectional view diagram taken along a line A-A' in FIG. 20 in accordance with another embodiment of the present disclosure.

FIG. 20 illustrates, in a schematic top-view diagram, an intermediate semiconductor device in accordance with another embodiment of the present disclosure. FIG. 21 is a schematic cross-sectional view diagram taken along a line A-A' in FIG. 20 in accordance with another embodiment of the present disclosure.

With reference to FIGS. 20 and 21, a second hard mask layer 309 may be formed on the first insulating layer 103 with a procedure similar to the first hard mask layer 301 illustrated in FIGS. 2 and 3. The second hard mask layer 309 may be formed of a same material as the first hardmask layer 301 but is not limited thereto. Second hard mask openings 311 may be formed along the second hard mask layer 309. In a top-view perspective, the second hard mask openings 311 may be disposed in a diagonal pattern. The second hard mask openings 311 may be vertically or horizontally disposed between adjacent pairs of the first slanted recesses 305. In other words, the first slanted recesses 305 and the second hard mask openings 311 may be alternatively disposed along the first axis X and the second axis Y. That is, the first slanted recesses 305 and the second hard mask openings 311 may be staggered. In a cross-sectional perspective, a ratio of the width W3 of the second hard mask openings 311 to the height H2 of the second hard mask openings 311 may be between about 5:1 and about 1:15, between about 3:1 and about 1:13, between about 1:1 and about 1:11, and between about 5:1 and about 1:8.

With reference to FIGS. 20 and 21, a second slanted etch process 403 may use the second hard mask layer 309 as pattern guides to remove portions of the first insulating layer 103 and concurrently form second slanted recesses 313 along the first insulating layer 103. In some embodiments, the angle of incidence δ of the second slanted etch process 403 may have a same value as the angle of incidence α of the first slanted etch process 401, but the incidence direction of the second slanted etch process 403 may be opposite to the incidence direction of the first slanted etch process 401. In other words, the angle of incidence δ of the second slanted etch process 403 may be opposite to the angle of incidence α of the first slanted etch process 401.

In some embodiments, the second slanted etch process 403 may be an anisotropic etch process such as a reactive ion etching process. The process parameters of the second slanted etch process 403 may be the same to the first slanted etch process 401 but only the angles of incidence are different.

In some embodiments, the angle of incidence δ of the second slanted etch process 403 may be between about −5 degree and about −80 degree, between about −20 degree and about −60 degree, and between about −20 degree and about −40 degree.

In some embodiments, the angle of incidence δ of the second slanted etch process 403 may be define by the width W3 of the second hard mask layer 309 and the height H2 of the second hard mask openings 311.

In some embodiments, the etch rate of the first insulating layer 103 of the second slanted etch process 403 may be faster than the etch rate of the second hard mask layer 309 of the second slanted etch process 403. For example, an etch rate ratio of the first insulating layer 103 to the second hard mask layer 309 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the second slanted etch process 403.

With reference to FIGS. 20 and 21, the width W4 of the second slanted recesses 313 may be less than the width W3 of the second hard mask openings 311. In some embodiments, the acute angles ε between the bottom surfaces 313BS of the second slanted recesses 313 and the sidewalls 313SW of the second slanted recesses 313 may be different from or opposite to the acute angles β between the bottom surfaces 305BS of the first slanted recesses 305 and the sidewalls 305SW of the first slanted recesses 305. In some embodiments, the acute angles £ between the bottom surfaces 313BS of the second slanted recesses 313 and the sidewalls 313SW of the second slanted recesses 313 may be between about −10 degree and about −85 degree, between about −20 degree and about −80 degree, between about −45 degree and about −80 degree, between about −60 degree and about −80 degree, and between about −70 degree and about −80 degree.

In some embodiments, the second slanted recesses 313 may be extended in a direction different from the first direction E1. In some embodiments, the second slanted recesses 313 may be extended in a second direction E2. The second direction E2 may be slanted with respect to the axis Z and the first axis X. The second direction E2 may be opposite to the first direction E1 with respect to the axis Z.

Figure 22:
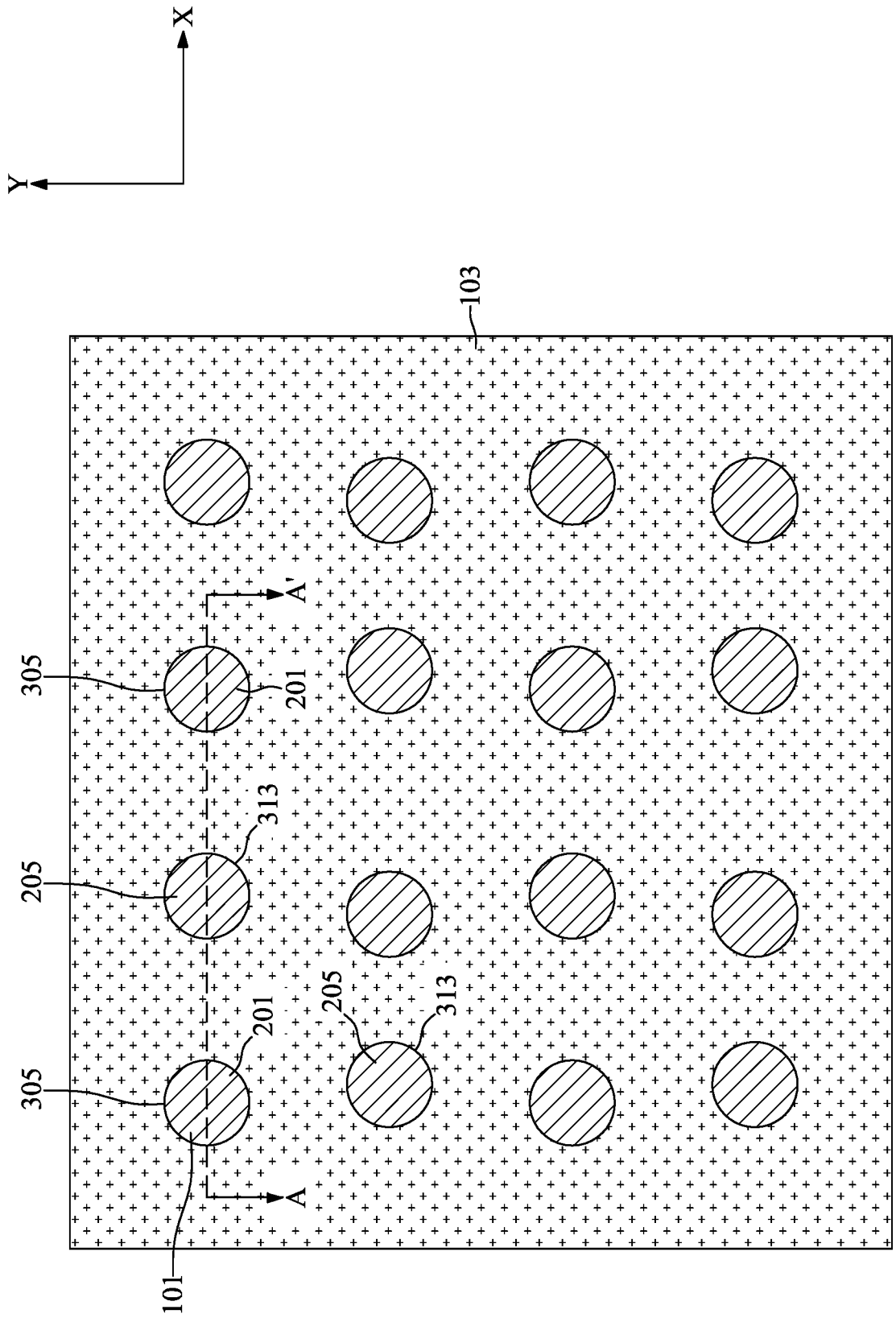
FIG. 22 illustrates, in a schematic top-view diagram, an intermediate semiconductor device in accordance with another embodiment of the present disclosure.
Figure 23:
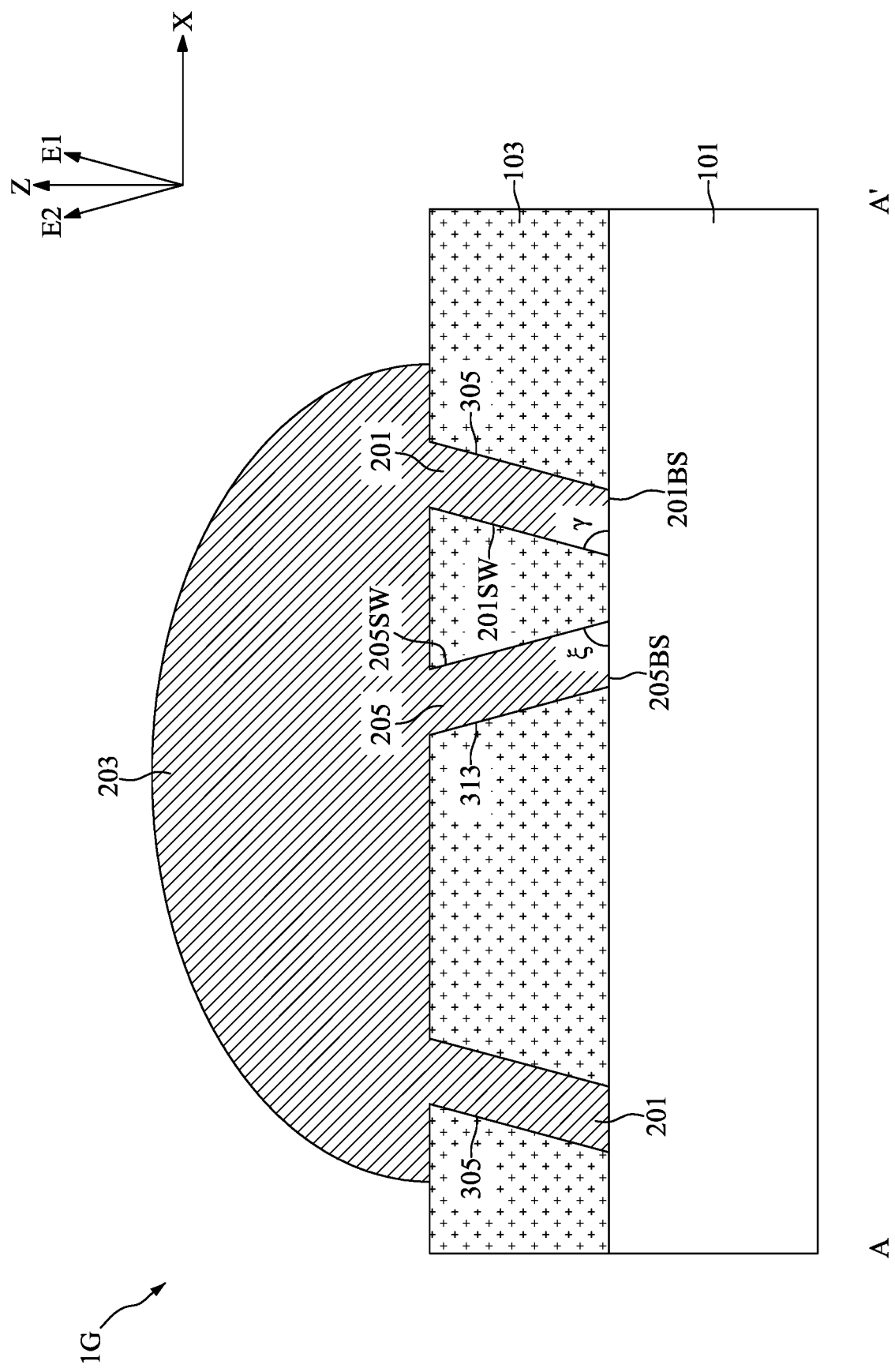
FIG. 23 is a schematic cross-sectional view diagram taken along a line A-A' in FIG. 22 in accordance with another embodiment of the present disclosure.

FIG. 22 illustrates, in a schematic top-view diagram, an intermediate semiconductor device in accordance with another embodiment of the present disclosure. FIG. 23 is a schematic cross-sectional view diagram taken along a line A-A' in FIG. 22 in accordance with another embodiment of the present disclosure.

With reference to FIGS. 22 and 23, a procedure similar to that illustrated in FIGS. 6, 7, and 14 may be performed to remove the second hard mask layer 309 and form the first slanted conductive layers 201, the second slanted conductive layers 205, and the top conductive layer 203. The first slanted conductive layers 201 may be formed in the first slanted recesses 305 and may have same acute angles γ and extension direction as illustrated in FIG. 8.

The second slanted conductive layers 205 may be formed in the second slanted recesses 313. In a cross-sectional perspective, the shape of the second slanted conductive layers 205 may be defined by the second slanted recesses 313. That is, in some embodiments, the acute angles ζ between the bottom surfaces 205BS of the second slanted conductive layers 205 and the sidewalls 205SW of the second slanted conductive layers 205 may be between about −10 degree and about −85 degree, between about −20 degree and about −80 degree, between about −45 degree and about −80 degree, between about −60 degree and about −80 degree, and between about −70 degree and about −80 degree. In some embodiments, one of the first slanted conductive layers 201 and an adjacent one of the second slanted conductive layers 205 may be extended in different directions. In some embodiments, the second slanted conductive layers 205 may be extended in the second direction E2.

The top conductive layer 203 may formed on the first insulating layer 103 and covering the first slanted conductive layers 201 and the second slanted conductive layers 205.

Figure 24:
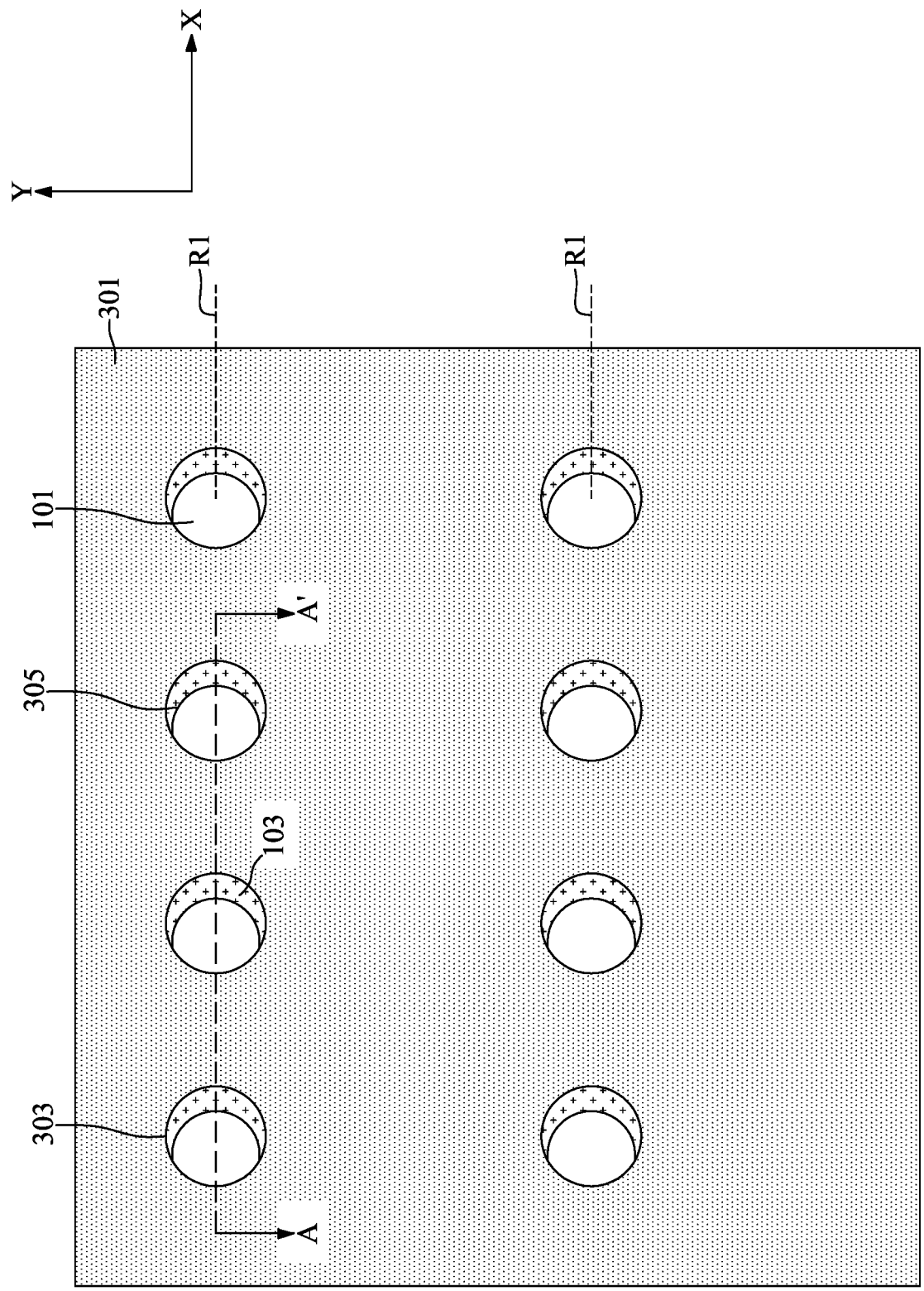
FIG. 24 illustrates, in a schematic top-view diagram, an intermediate semiconductor device in accordance with another embodiment of the present disclosure.
Figure 25:
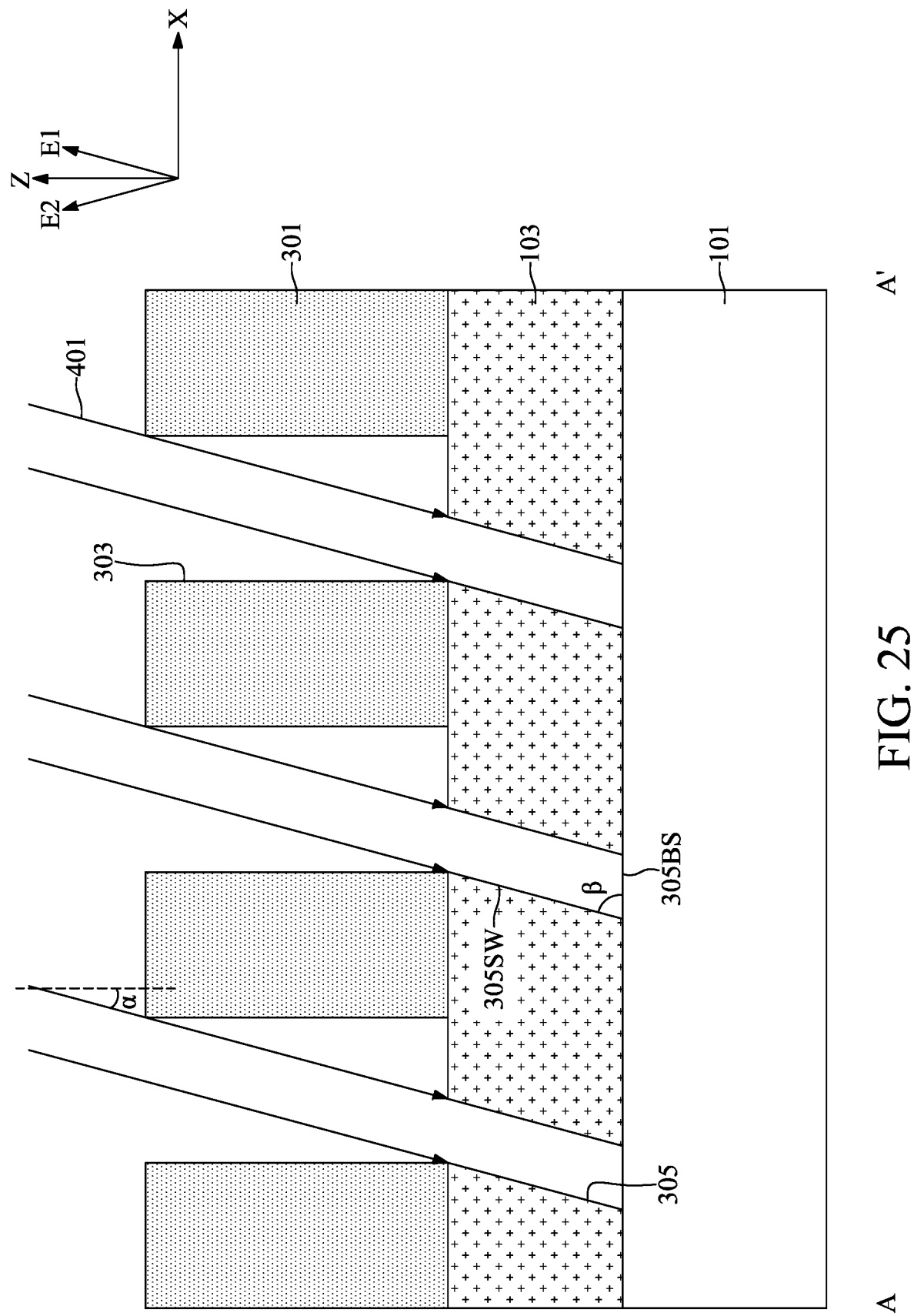
FIG. 25 is a schematic cross-sectional view diagrams taken along a line A-A' in FIG. 24 in accordance with another embodiment of the present disclosure.

FIG. 24 illustrates, in a schematic top-view diagram, an intermediate semiconductor device in accordance with another embodiment of the present disclosure. FIG. 25 is a schematic cross-sectional view diagrams taken along a line A-A' in FIG. 24 in accordance with another embodiment of the present disclosure.

With reference to FIGS. 24 and 25, for fabrication of a semiconductor device 1H, an intermediate semiconductor device may be fabricating with a procedure similar to that illustrated in FIGS. 2 to 5. In a top-view perspective, the first hard mask openings 303 may be disposed along a first set of rows R1. The first set of rows R1 may be parallel to the first axis X. The arrangement of the first slanted recesses 305 may be similar to the arrangement of the first hard mask openings 303. In a cross-sectional perspective, the first slanted recesses 305 may have similar acute angles and extension direction as illustrated in FIG. 5. After the formation of the first slanted recesses 305, the first hard mask layer 301 may be removed.

Figure 26:
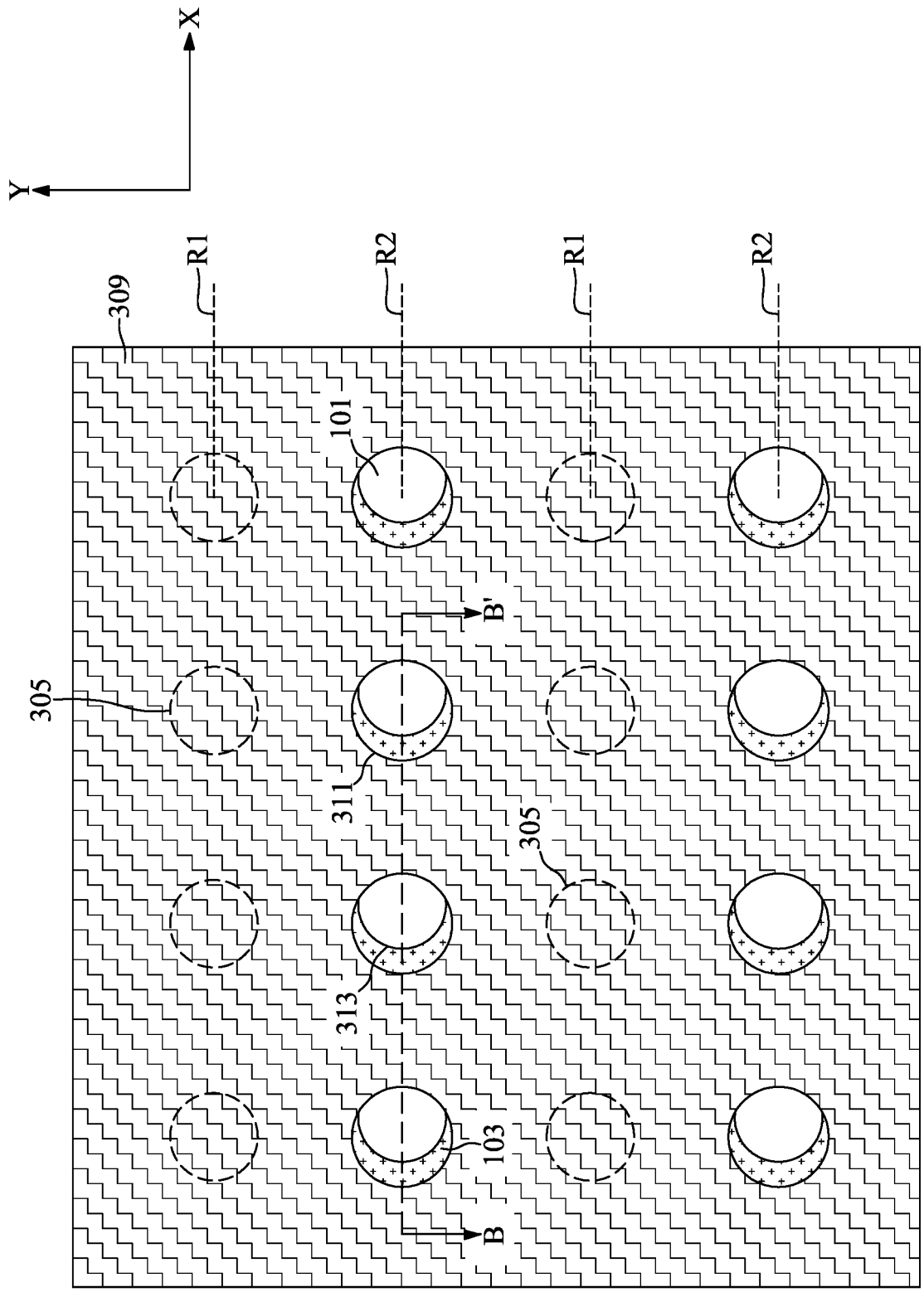
FIG. 26 illustrates, in a schematic top-view diagram, an intermediate semiconductor device in accordance with another embodiment of the present disclosure.
Figure 27:
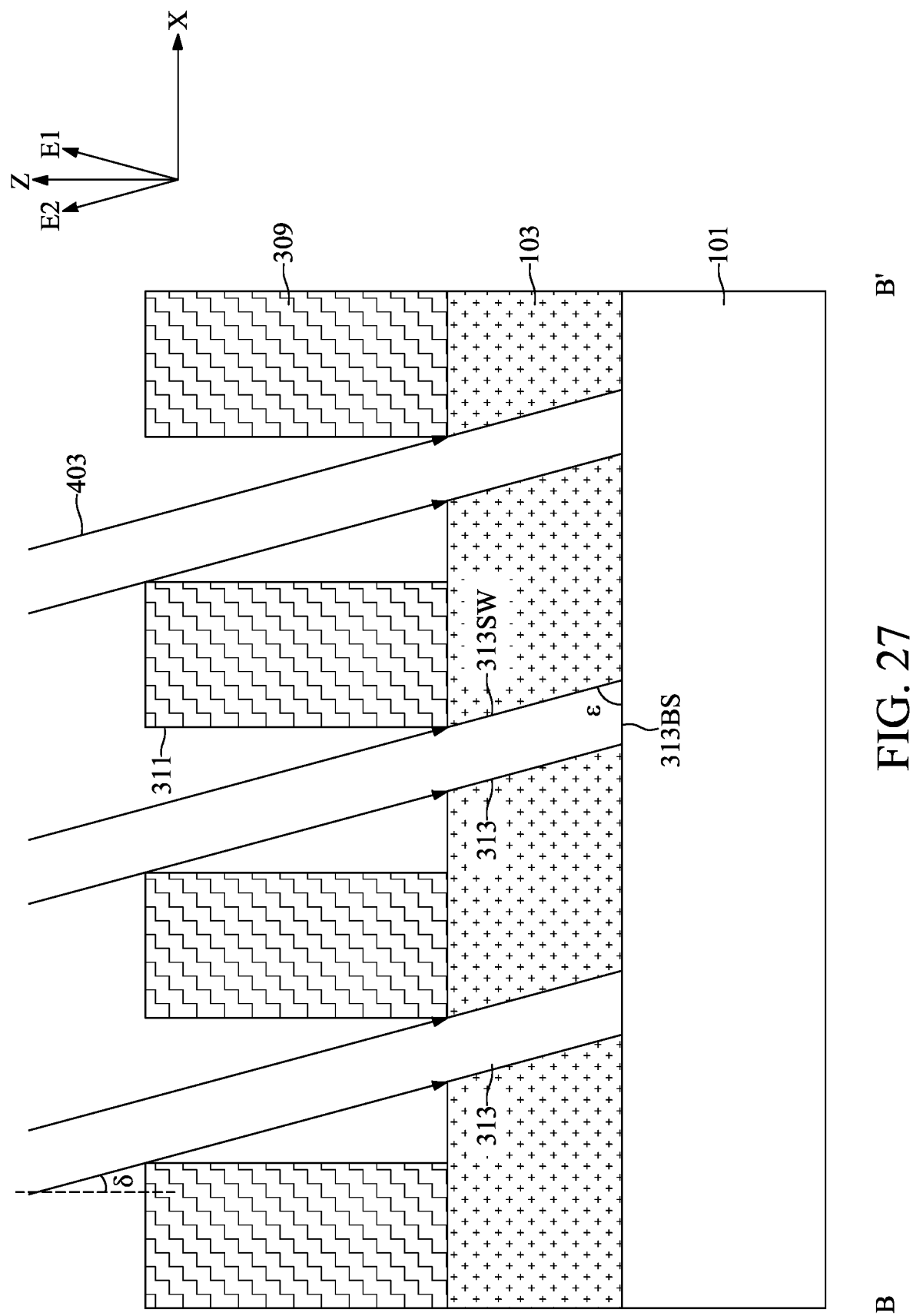
FIG. 27 is a schematic cross-sectional view diagrams taken along a line B-B' in FIG. 26 in accordance with another embodiment of the present disclosure.

FIG. 26 illustrates, in a schematic top-view diagram, an intermediate semiconductor device in accordance with another embodiment of the present disclosure. FIG. 27 is a schematic cross-sectional view diagrams taken along a line B-B' in FIG. 26 in accordance with another embodiment of the present disclosure.

With reference to FIGS. 26 and 27, a procedure similar to that illustrated in FIGS. 20 and 21 may be performed. In a top-view perspective, the second hard mask openings 311 may be disposed along a second set of rows R2. The second set of rows R2 may be parallel to the first axis X. The first set of rows R1 and the second set of row R2 may be alternatively arranged; in other words, the first set of rows R1 and the second set of row R2 may be staggered. The arrangement of the second slanted recesses 313 may be similar to the arrangement of the second hard mask openings 311. In a cross-sectional perspective, the second slanted recesses 313 may have similar acute angles and extension direction as illustrated in FIG. 21.

Figure 28:
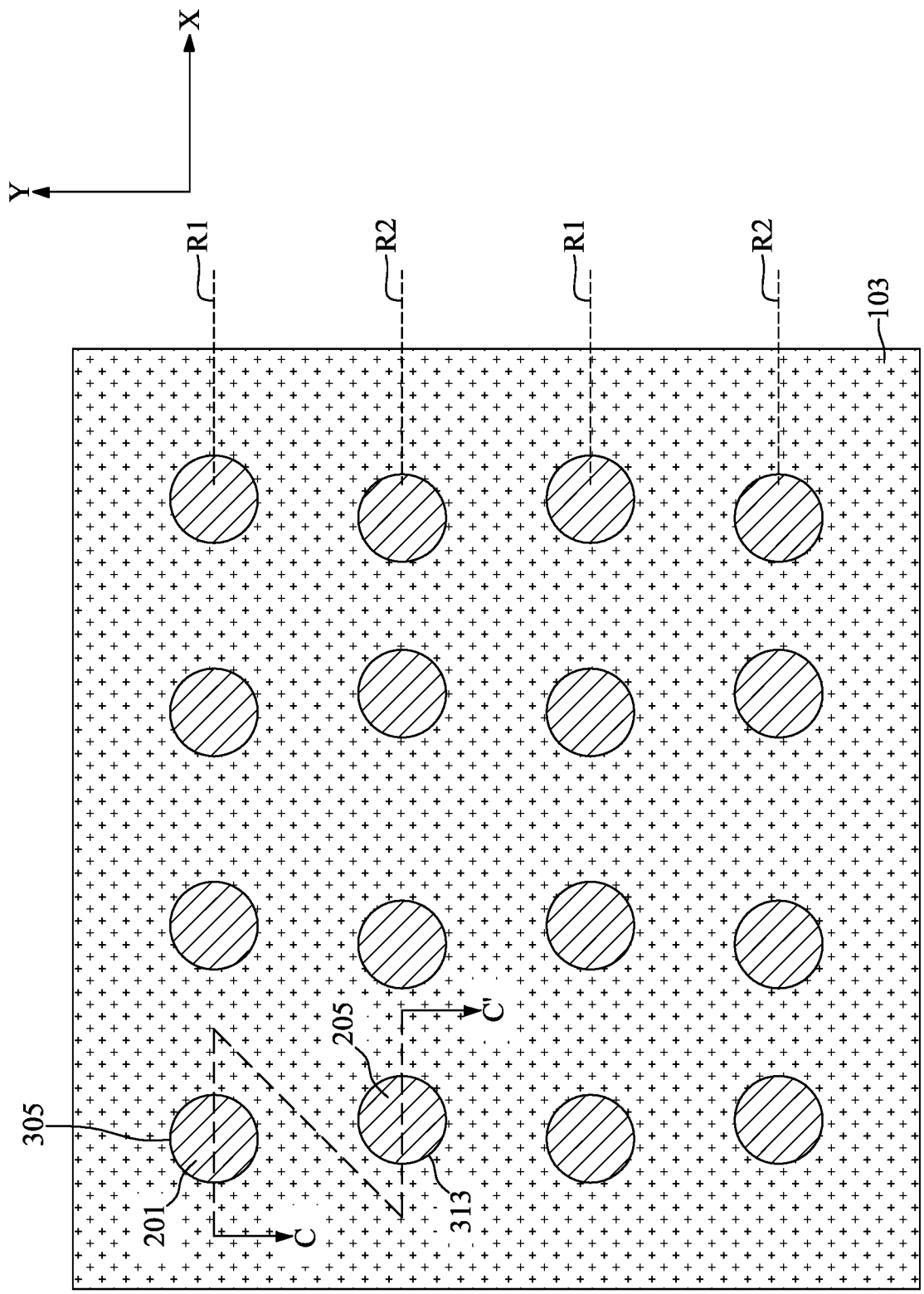
FIG. 28 illustrates, in a schematic top-view diagram, an intermediate semiconductor device in accordance with another embodiment of the present disclosure.
Figure 29:
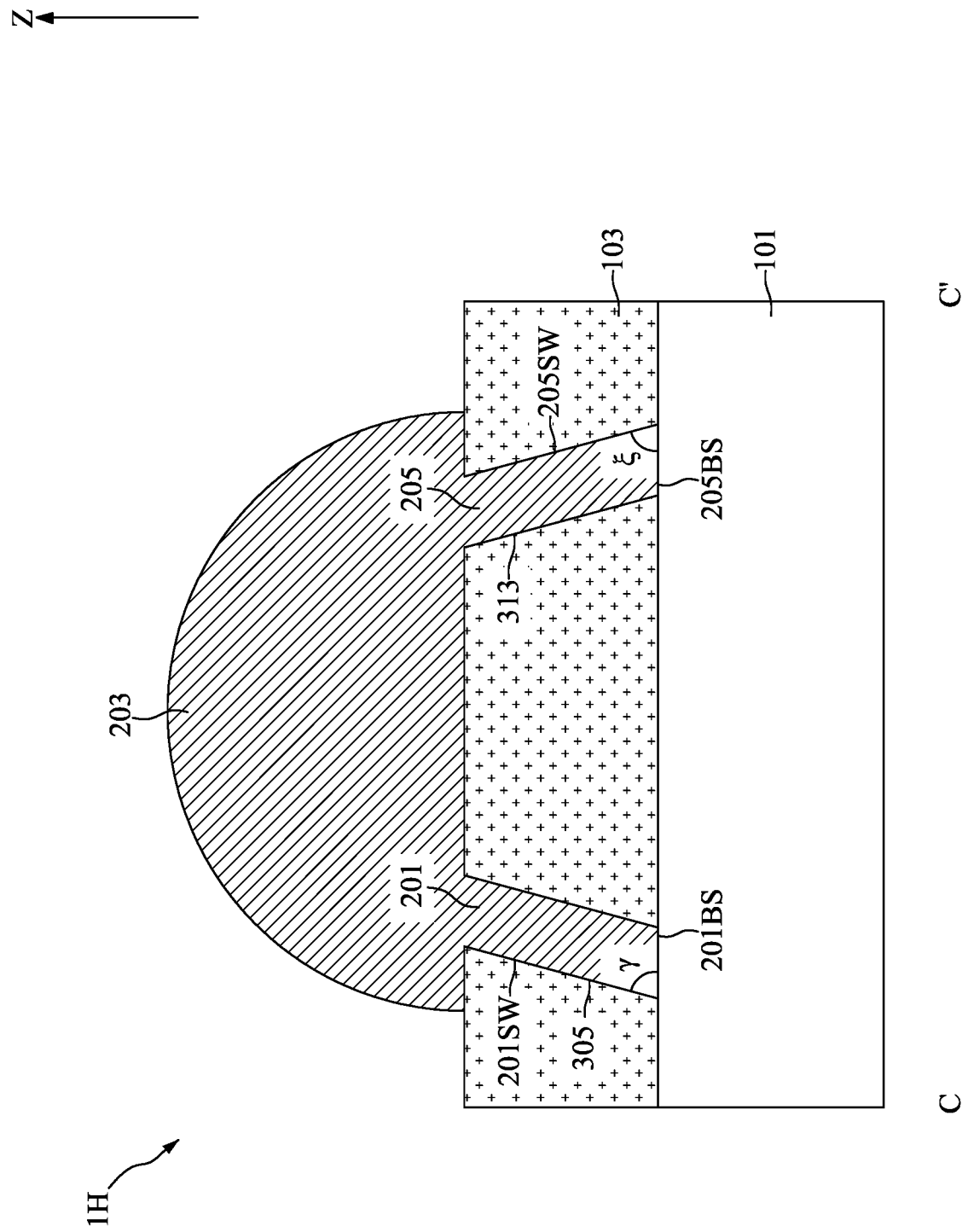
FIG. 29 is a schematic cross-sectional view diagrams taken along a line C-C' in FIG. 28 in accordance with another embodiment of the present disclosure.

FIG. 28 illustrates, in a schematic top-view diagram, an intermediate semiconductor device in accordance with another embodiment of the present disclosure. FIG. 29 is a schematic cross-sectional view diagrams taken along a line C-C' in FIG. 28 in accordance with another embodiment of the present disclosure.

With reference to FIGS. 28 and 29, a procedure similar to that illustrated in FIGS. 22 and 23 may be performed to remove the second hardmask layer 309 and form the first slanted conductive layers 201, the second slanted conductive layers 205, and the top conductive layer 203. In a cross-sectional perspective, the first slanted conductive layers 201 may be formed in the first slanted recesses 305 and may have same acute angles γ and extension direction as illustrated in FIG. 23. The second slanted conductive layers 205 may be formed in the second slanted recesses 313 and may have same acute angles ζ and extension direction as illustrated in FIG. 23. In a top-view perspective, the first slanted conductive layers 201 may be disposed along the first set of rows R1 and the second slanted conductive layers 205 may be disposed along the second set of rows R2. Due to the different incidence direction of the first slanted etch process 401 and the second slanted etch process 403, the second slanted conductive layers 205 may be offset from the first slanted conductive layers 201 with respect to the second axis Y.

The top conductive layer 203 may formed on the first insulating layer 103 and covering the first slanted conductive layers 201 and the second slanted conductive layers 205.

One aspect of the present disclosure provides a semiconductor device including a substrate, a first insulating layer positioned above the substrate, first slanted conductive layers positioned in the first insulating layer, and a top conductive layer positioned covering the first slanted conductive layers.

Another aspect of the present disclosure provides a method for fabricating a semiconductor device including providing a substrate, forming a first insulating layer above the substrate, forming first slanted recesses along the first insulating layer, and forming first slanted conductive layers in the first slanted recesses and a top conductive layer covering the first slanted conductive layers.

Due to the design of the semiconductor device of the present disclosure, the first slanted conductive layers 201 may provide more contact surface to the substrate 101.

Therefore, the electrical characteristics of the semiconductor device 1A may be improved. That is, the performance of the semiconductor device 1A may be improved. In addition, the narrower first slanted recesses 305 may be formed using first hard mask layer 301 having wider first hard mask openings 303. In other words, the requirements of photolithography process for forming the narrower first slanted recesses 305 may be alleviated. As a result, the yield of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a first insulating layer positioned above the substrate;
   first slanted conductive layers positioned in the first insulating layer; and
   a top conductive layer positioned covering the first slanted conductive layers;
   a barrier layer positioned between the first insulating layer and the first slanted conductive layers, between the top conductive layer and the first insulating layer, and between the first slanted conductive layers and the substrate, wherein the barrier layer is formed of titanium, titanium nitride, titanium silicon nitride, tantalum, tantalum nitride, tantalum silicon nitride, or a combination thereof.

2. The semiconductor device of claim 1, wherein acute angles between bottom surfaces of the first slanted conductive layers and sidewalls of the first slanted conductive layers are between about 10 degree and about 85 degree.

3. The semiconductor device of claim 2, wherein the first slanted conductive layers are arranged in a grid dot pattern in a top-view perspective.

4. The semiconductor device of claim 2, wherein the first slanted conductive layers are arranged in a diagonal dot pattern in a top-view perspective.

5. The semiconductor device of claim 3, wherein the top conductive layer is a conductive line and is formed of copper, aluminum, titanium, tungsten, or a combination thereof.

6. The semiconductor device of claim 2, wherein the top conductive layer is a solder unit and is formed of a material including tin, silver, copper, gold, alloy or a combination thereof.

7. The semiconductor device of claim 6, further comprising an under bump metallization layer positioned between the first insulating layer and the first slanted conductive layers, between the top conductive layer and the first insulating layer, and between the first slanted conductive layers and the substrate, wherein the under bump metallization layer comprises titanium, titanium-tungsten, chromium, aluminum, copper, nickel, chromium-copper, or nickel-vanadium.

8. The semiconductor device of claim 2, further comprising second slanted conductive layers positioned in the first insulating layer, wherein the top conductive layer is positioned covering the first slanted conductive layers and the second slanted conductive layers.

9. The semiconductor device of claim 8, wherein acute angles between bottom surfaces of the second slanted conductive layers and sidewalls of the second slanted conductive layers are between about −10 degree and about −85 degree.

10. The semiconductor device of claim 8, wherein the first slanted conductive layers extend along a first direction, the second slanted conductive layers extend along a second direction, and the second direction is different from the first direction.

11. The semiconductor device of claim 10, wherein the first slanted conductive layers and the second slanted conductive layers are alternatively arranged along a first axis and a second axis in a top-view perspective and the first axis and the second axis are perpendicular to each other.

12. The semiconductor device of claim 10, wherein the first slanted conductive layers are arranged along a first set of rows, the second slanted conductive layers are arranged along a second set of rows, and the first set of rows and the second set of rows are alternatively arranged.

13. The semiconductor device of claim 1, wherein a thickness of the barrier layer is between about 10 angstroms and about 15 angstroms.

* * * * *